US012575278B2

(12) United States Patent
Sung et al.

(10) Patent No.: US 12,575,278 B2
(45) Date of Patent: Mar. 10, 2026

(54) DISPLAY PANEL, ELECTRONIC DEVICE INCLUDING THE SAME, AND METHOD OF MANUFACTURING DISPLAY PANEL

(71) Applicant: SAMSUNG DISPLAY CO., LTD., Yongin-si (KR)

(72) Inventors: Taehyun Sung, Yongin-si (KR); Sangyeol Kim, Yongin-si (KR); Seungsoo Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 415 days.

(21) Appl. No.: 18/194,021

(22) Filed: Mar. 31, 2023

(65) Prior Publication Data

US 2024/0023389 A1 Jan. 18, 2024

(30) Foreign Application Priority Data

Jul. 12, 2022 (KR) ........................ 10-2022-0085465

(51) Int. Cl.
*H10K 59/131* (2023.01)
*H10K 59/12* (2023.01)
*H10K 59/35* (2023.01)

(52) U.S. Cl.
CPC ....... *H10K 59/131* (2023.02); *H10K 59/1201* (2023.02); *H10K 59/351* (2023.02)

(58) Field of Classification Search
CPC . H10K 59/131; H10K 59/1201; H10K 59/351
USPC ......................................................... 257/89
See application file for complete search history.

(56) References Cited

U.S. PATENT DOCUMENTS

| | | | |
|---|---|---|---|
| 11,386,850 B2 | 7/2022 | Park et al. | |
| 11,424,306 B2 | 8/2022 | Jeon et al. | |
| 2017/0110521 A1 | 4/2017 | Park et al. | |
| 2021/0118961 A1* | 4/2021 | Lee ..................... | H10K 59/131 |
| 2021/0191552 A1 | 6/2021 | Bok et al. | |
| 2021/0200263 A1 | 7/2021 | Hu et al. | |
| 2021/0305343 A1 | 9/2021 | Oh et al. | |
| 2022/0020835 A1 | 1/2022 | Choi et al. | |
| 2022/0028949 A1 | 1/2022 | Ko et al. | |

(Continued)

FOREIGN PATENT DOCUMENTS

| | | |
|---|---|---|
| CN | 111653201 | 9/2020 |
| CN | 112038373 | 12/2020 |

(Continued)

*Primary Examiner* — Xia L Cross
(74) *Attorney, Agent, or Firm* — F. CHAU & ASSOCIATES, LLC

(57) ABSTRACT

A display panel includes a base layer including first and second areas, a connection line, and first and second pixels, wherein the first pixel includes a first light emitting element of a first group including a first pixel electrode disposed in the first area, a second light emitting element of the first group disposed in the first area, and a first pixel circuit connected to the first and second light emitting elements and disposed in the second area, the second pixel includes a light emitting element and a second pixel circuit that are disposed in the second area, and the connection line includes a first connection line for connecting the first pixel electrode and the first pixel circuit, wherein a common electrode includes at least one electrode opening disposed between the first and second light emitting elements.

20 Claims, 15 Drawing Sheets

(56) References Cited

U.S. PATENT DOCUMENTS

| | | | |
|---|---|---|---|
| 2022/0029125 A1 | 1/2022 | Liu et al. | |
| 2022/0069048 A1 | 3/2022 | Bok et al. | |
| 2022/0149129 A1* | 5/2022 | Park | H10K 59/121 |
| 2022/0310768 A1 | 9/2022 | Long et al. | |
| 2024/0210773 A1* | 6/2024 | Wang | H01Q 1/243 |

FOREIGN PATENT DOCUMENTS

| | | |
|---|---|---|
| KR | 10-2020-0131400 | 11/2020 |
| KR | 10-2021-0082316 | 7/2021 |
| KR | 10-2021-0094189 | 7/2021 |
| KR | 10-2021-0121372 | 10/2021 |
| KR | 10-2022-0008992 | 1/2022 |
| KR | 10-2022-0011842 | 2/2022 |
| KR | 10-2022-0031796 | 3/2022 |
| WO | 2021147081 | 7/2021 |

* cited by examiner

DISPLAY PANEL, ELECTRONIC DEVICE INCLUDING THE SAME, AND METHOD OF MANUFACTURING DISPLAY PANEL

CROSS-REFERENCE TO RELATED APPLICATION

This U.S. non-provisional patent application claims priority under 35 U.S.C. § 119 to Korean Patent Application No. 10-2022-0085465, filed on Jul. 12, 2022, the entire disclosure of which is incorporated by reference herein.

1. TECHNICAL FIELD

The present disclosure herein relates to a display panel including a display area through which an optical signal passes, an electronic device including the same, and a method of manufacturing the display panel.

2. DISCUSSION OF RELATED ART

An electronic device may include a display panel and various electronic parts such as an electronic module. The electronic module may include a camera, an infrared sensor, a proximity sensor, or the like. The electronic module may be disposed under the display panel. Transmittance in one area of the display panel may be higher than that in another area of the display panel. The electronic module may receive or transmit an optical signal through the partial area having high transmittance.

For example, the electronic module may be a camera module, a sensor for measuring a distance between an object and a mobile phone, such as a proximity sensor, a sensor for recognizing a part of a user's body (e.g., a fingerprint, an iris, or a face), or the like. However, the operation of the electronic module may be affected by a structure inside the display panel. Research on the internal structures of the display panel is underway to improve the reliability of the electronic module.

SUMMARY

At least one embodiment of the present disclosure provides a display panel having increased transmittance for an optical signal.

At least one embodiment of the present disclosure provides an electronic device having increased transmittance for an optical signal.

At least one embodiment of the present disclosure provides a method of manufacturing the display panel having increased reliability.

An embodiment of the inventive concept provides a display panel including a base layer including a first area through which an optical signal passes and a second area adjacent to the first area, connection lines disposed on the base layer, and first pixels and second pixels disposed on the base layer, wherein at least one of the first pixels includes: a first light emitting element of a first group including a first pixel electrode disposed in the first area, a first light emitting layer disposed on the first pixel electrode, and a common electrode disposed on the first light emitting layer; and a first pixel circuit electrically connected to the first light emitting element of the first group and disposed in the second area, at least one of the second pixels includes a light emitting element of a second group including a pixel electrode disposed in the second area, and a second pixel circuit connected to the light emitting element of the second group and disposed in the second area, and at least one of the connection lines includes a first connection line configured to connect the first pixel electrode and the first pixel circuit, wherein the common electrode includes an electrode opening overlapping the connection line when viewed in a plan view.

In an embodiment, the first pixel may further include a second light emitting element of the first group including a second pixel electrode disposed in the first area, a second light emitting layer disposed on the second pixel electrode, and the common electrode disposed on the second light emitting layer.

In an embodiment, when viewed in a plan view, at least a portion of the common electrode may extend from the first light emitting element of the first group to the second light emitting element of the first group.

In an embodiment, the connection line may further include a second connection line configured to connect the first pixel electrode and the second pixel electrode.

In an embodiment, the first connection line may be insulated from the second connection line, and the first connection line may overlap at least a portion of the second connection line when viewed in a plan view.

In an embodiment, the first pixels may include a first color pixel, a second color pixel, and a third color pixel configured to generate light of different colors, wherein each of the first color pixel to the third color pixel includes the first light emitting element of the first group, a second light emitting element of the first group, and the first pixel circuit.

In an embodiment, the connection lines may include a transparent conductive material.

In an embodiment, the base layer may further include a third area adjacent to the second area, the display panel may further include third pixels disposed in the third area, and at least one of the third pixels may include a light emitting element of a third group including a pixel electrode disposed in the third area and a third pixel circuit disposed in the third area.

In an embodiment, the base layer may include a first light blocking pattern disposed on a lower portion of the first pixel electrode and a second light blocking pattern disposed on a lower portion of a second pixel electrode, wherein the first light blocking pattern and the second light blocking pattern are spaced apart from each other.

In an embodiment of the inventive concept, an electronic device includes: a display panel including a base layer having a first area through which an optical signal passes, a second area which is adjacent to the first area and blocks an optical signal, and a third area adjacent to the second area, and first to third pixels disposed on the base layer; and an electronic module which overlaps the first area when viewed in a plan view and is disposed under the base layer, wherein at least one of the first pixels includes a first light emitting element of a first group including a first pixel electrode disposed in the first area, a second light emitting element of the first group including a second pixel electrode disposed in the first area, and a first pixel circuit connected to the first pixel electrode and disposed in the second area, at least one of the second pixels includes a light emitting element of a second group including a pixel electrode disposed in the second area, and a second pixel circuit connected to the pixel electrode disposed in the second area and disposed in the second area, and at least one of the third pixels includes a light emitting element of a third group including a pixel electrode disposed in the third area, and a third pixel circuit connected to the pixel electrode disposed in the third area and disposed in the third area, wherein the first light emitting element of the first group, the second light emitting element of the first group, the light emitting element of the second group, and the light emitting element of the third group, comprises a common electrode having an integral shape, and an electrode opening is disposed in the common electrode between the first light emitting element of the first group and the second light emitting element of the first group.

In an embodiment, when viewed in a plan view, at least a portion of the common electrode may extend from the first light emitting element of the first group to the second light emitting element of the first group.

In an embodiment, when viewed in a plan view, the electrode opening overlaps the first area and does not overlap the second and third areas.

In an embodiment, the display panel may further include a first connection line configured to connect the first pixel electrode and the first pixel circuit, and a second connection line configured to connect the first pixel electrode and the second pixel electrode.

In an embodiment, when viewed in a plan view, at least a portion of the first connection line may overlap the electrode opening.

In an embodiment, each of the first connection line and the second connection line may include a transparent conductive material.

In an embodiment, the base layer may include a first light blocking pattern disposed on a lower portion of the first pixel electrode and a second light blocking pattern disposed on a lower portion of the second pixel electrode, wherein the first light blocking pattern and the second light blocking pattern are spaced apart from each other.

In an embodiment, the first pixels may include a first color pixel, a second color pixel, and a third color pixel configured to generate light of different colors, wherein each of the first color pixel to the third color pixel includes the first light emitting element of the first group, the second light emitting element of the first group, and the first pixel circuit.

In an embodiment of the inventive concept, a method of manufacturing a display panel includes: providing a preliminary display panel including a first light emitting element of a first group disposed in a first area, a second light emitting element of the first group disposed in the first area, a light emitting element of a second group disposed in a second area, a first pixel circuit disposed in the second area and connected to the first light emitting element of the first group, aa second pixel circuit disposed in the second area and connected to the light emitting element of the second group, and a removal portion, and irradiating the removal portion with a laser beam, wherein each of the first light emitting element of the first group, the second light emitting element of the first group, and the light emitting element of the second group includes a pixel electrode, a light emitting layer disposed on the pixel electrode, and a common electrode disposed on the light emitting layer, wherein the common electrode included in the first light emitting element of the first group, the second light emitting element of the first group, and the light emitting element of the second group has an integral shape; and wherein the removal portion is defined in the common electrode and is defined, when in a plan view, between the first light emitting element of the first group and the second light emitting element of the first group.

In an embodiment, the first light emitting element of the first group may be electrically connected to the first pixel circuit through a connection line, and when viewed in a plane, at least a portion of the opening may overlap the connection line.

In an embodiment, when viewed in a plan view, at least a portion of the common electrode may connect the first light emitting element of the first group and the second light emitting element of the first group.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to describe principles of the inventive concept. In the drawings:

FIG. 6B is an enlarged plan view illustrating a portion of a first area of FIG. 6A;

FIGS. 10A to 10C are cross-sectional views illustrating steps of a method of manufacturing a display panel according to an embodiment of the inventive concept;

DETAILED DESCRIPTION

Figure 1:
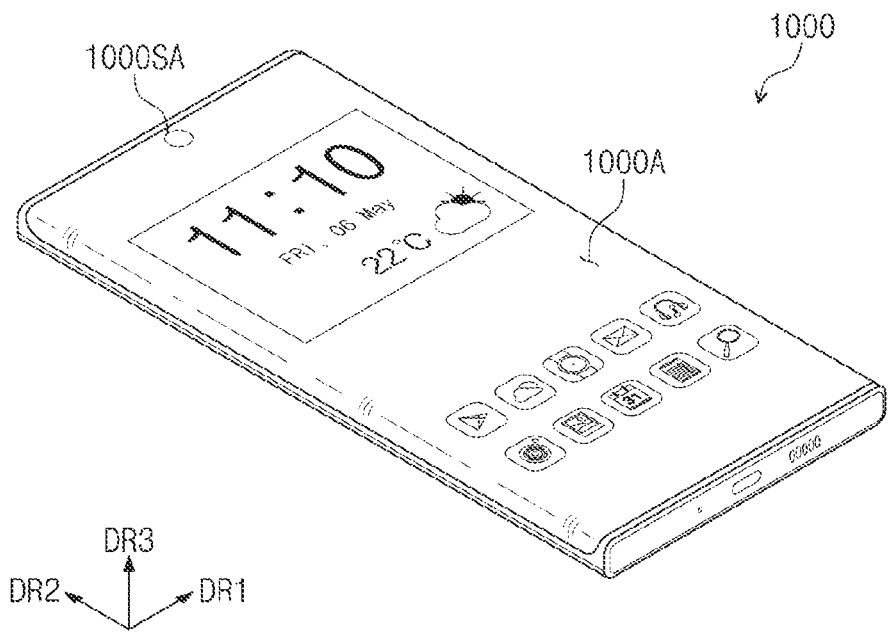
FIG. 1 is a perspective view of an electronic device according to an embodiment of the inventive concept.

As the inventive concept can have various changes and modifications made thereto and take many forms, specific embodiments of the inventive concept are illustrated in the accompanying drawings and are hereinafter described in detail. However, it should be understood that this is not intended to limit the inventive concept to specific embodiments, but is intended to include all changes and modifications, equivalents, and substitutes within the spirit and scope of the inventive concept.

It will be understood that when an element or layer (or region, portion, and the like) is referred to as being "on", "connected to", or "coupled to" another element or layer, it can be directly on, connected to, or coupled to the other element or layer, or intervening elements or layers may be present.

In this specification, meanwhile, when a layer, film, region, substrate, etc. is said to be "directly disposed" on another element, this may mean that there are no layers, films, regions, substrates, etc. intervening between the other element and the layer, film, region, substrate, etc. For example, "directly disposed" may mean that two layers or two members are disposed without using an additional member, such as an adhesive member, between the two layers or between the two members.

Like reference numerals refer to like elements throughout this specification. In the figures, the thicknesses, ratios, and dimensions of elements may be exaggerated for effective description of the technical contents. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention. As used herein, the singular forms, "a", "an", and "the" are intended to include the plural forms as well, unless the context clearly indicates otherwise.

Spatially relative terms, such as "beneath", "below", "lower", "above", and "upper", may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In this specification, "disposed on" may refer to not only a case of being disposed on an upper portion of a certain member but also a case of being disposed on a lower portion thereof.

Hereinafter, a display panel, an electronic device, and a method of manufacturing the display panel according to an embodiment of the inventive concept will be described with reference to the accompanying drawings.

FIG. 1 is a perspective view of an electronic device 1000 according to an embodiment of the inventive concept.

Referring to FIG. 1, the electronic device 1000 may include a display device, and a mobile phone is illustrated as an example in this embodiment. However, the electronic device 1000 is not limited thereto and may be a tablet, a monitor, a television, a car navigation device, a game machine, or a wearable device.

The electronic device 1000 may display an image through a display area 1000A. The display area 1000A may include a plane defined by a first direction DR1 and a second direction DR2. In this specification, "when viewed in a plane" or "in a plan view" may be understood as a state of being viewed in a plane parallel to the plane defined by the first direction DR1 and the second direction DR2. In this specification, "overlap" may be understood as overlapping when viewed in a plane unless otherwise defined.

The display area 1000A may further include curved surfaces respectively bent from at least two sides of the plane. However, the shape of the display area 1000A is not limited thereto. For example, the display area 1000A may include only the plane or may further include four curved surfaces respectively bent from at least two sides, for example, four sides of the plane.

A partial area of the display area 1000A may be defined as a sensing area 1000SA. Although one sensing area 1000SA is illustrated in FIG. 1 as an example, the number of sensing areas 1000SA is not limited thereto. The sensing area 1000SA may be a portion of the display area 1000A but may have a higher transmittance for an optical signal than other portions of the display area 1000A. Accordingly, the electronic device 1000 may display an image through the sensing area 1000SA and may provide an optical signal through the sensing area 1000SA.

The electronic device 1000 may include an electronic module disposed in an area overlapping the sensing area 1000SA. The electronic module may receive an optical signal provided from the outside through the sensing area 1000SA or may output an optical signal through the sensing area 1000SA. For example, the electronic module may be a camera module, a sensor for measuring a distance between an object and a mobile phone, such as a proximity sensor, a sensor for recognizing a part of a user's body (e.g., a fingerprint, an iris, or a face), or a small lamp for outputting light, but is not particularly limited thereto.

A thickness direction of the electronic device 1000 may be a third direction DR3 that is a normal direction of the display area 1000A. A front surface (or a top surface) and a rear surface (or a bottom surface) of each of members constituting the electronic device 1000 may be defined on the basis of the third direction DR3.

Figure 2:
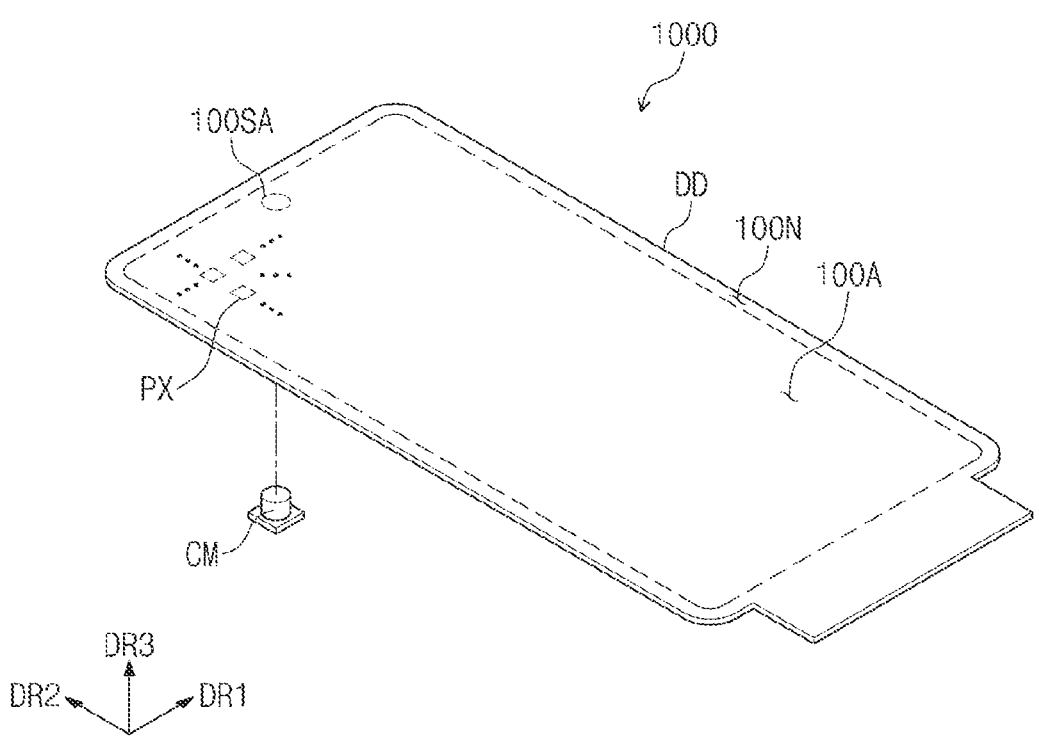
FIG. 2 is an exploded perspective view illustrating some components of an electronic device according to an embodiment of the inventive concept.

FIG. 2 is an exploded perspective view illustrating some components of the electronic device 1000 according to an embodiment of the inventive concept.

Referring to FIG. 2, the electronic device 1000 may include a display device DD and a camera module CM. The display device DD may generate an image and sense an external input. The camera module CM is disposed under the display device DD. When the display device DD is defined as a first electronic module constituting the electronic device 1000, the camera module CM may be defined as a second electronic module.

The display device DD may include a display area 100A and a peripheral area 100N. The display area 100A may correspond to the display area 1000A illustrated in FIG. 1. A partial area of the display area 100A may be defined as a sensing area 100SA, and the sensing area 100SA may have transmittance higher than that of another area (hereinafter referred to as a main display area) of the display area 100A. Accordingly, the sensing area 100SA may provide external natural light to the camera module CM. Because the sensing area 100SA is a portion of the display area 100A, an image may be displayed in the sensing area 100SA.

Pixels PX are disposed in the display area 100A. The pixels PX are disposed in the sensing area 100SA and a main display area of the display area 100A outside the sensing area 100SA. However, the configuration of each of pixels PX disposed in the sensing area 100SA may be different from the configuration of each of pixels PX disposed in the main display area. A detailed description thereof will be given later.

Figure 3:
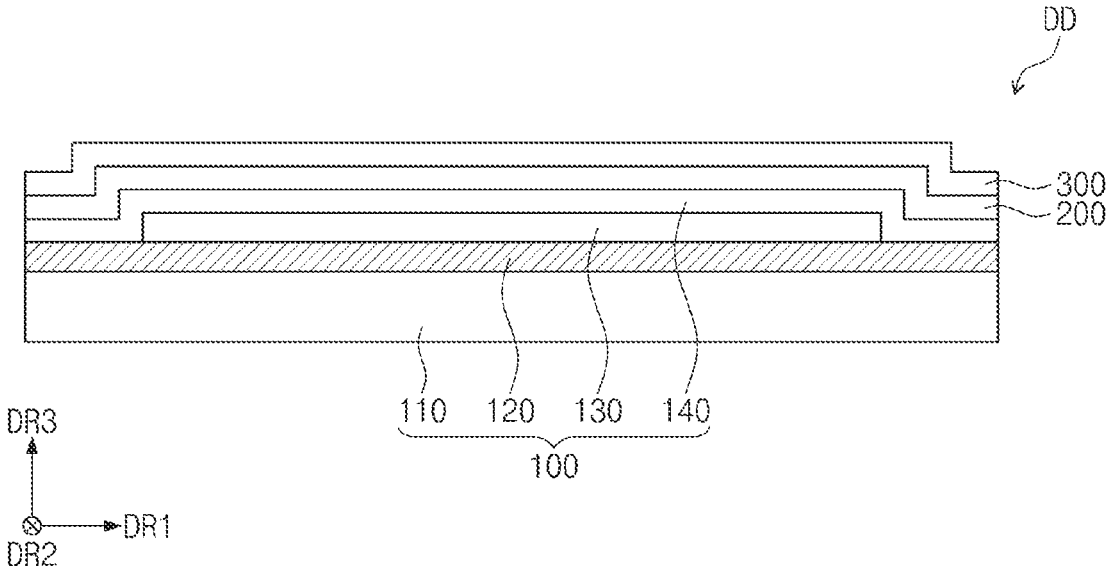
FIG. 3 is a cross-sectional view of a display device according to an embodiment of the inventive concept.

FIG. 3 is a cross-sectional view of the display device DD according to an embodiment of the inventive concept.

Referring to FIG. 3, the display device DD may include a display panel 100, a sensor layer 200, and an anti-reflection layer 300.

The display panel 100 may be a component that substantially generates an image. The display panel 100 may be a light emitting display panel and may be, for example, an organic light emitting display panel, an inorganic light emitting display panel, a micro-LED display panel, or a nano-LED display panel. The display panel 100 may also be referred to as a display layer.

The display panel 100 may include a base layer 110, a circuit layer 120, a light emitting element layer 130, and an encapsulation layer 140.

The base layer 110 may be a member that provides a base surface on which the circuit layer 120 is disposed. The base layer 110 may be a rigid substrate or a flexible substrate capable of bending, folding, rolling, and the like. The base layer 110 may be a glass substrate, a metal substrate, a polymer substrate, or the like. However, embodiments of the inventive concept are not limited thereto, and the base layer 110 may be an inorganic layer, an organic layer, or a composite material layer.

The base layer 110 may have a multilayer structure. For example, the base layer 110 may include a first synthetic resin layer, a multilayer or single-layer inorganic layer, and a second synthetic resin layer disposed on the multilayer or single-layer inorganic layer. Each of the first and second synthetic resin layers may include polyimide-based resin and is not particularly limited.

The circuit layer 120 may be disposed on the base layer 110. The circuit layer 120 may include an insulating layer, a semiconductor pattern, a conductive pattern, a signal line, and the like. The insulating layer, a semiconductor layer, and a conductive layer may be provided on the base layer 110 by a method such as coating and deposition, and then, the insulating layer, the semiconductor layer, and the conductive layer may be selectively patterned by performing a photo-lithography process and an etching process one or more times.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, quantum dots, quantum rods, a micro-LED, or a nano-LED.

The encapsulation layer 140 may be disposed on the light emitting element layer 130. The encapsulation layer 140 may protect the light emitting element layer 130 from foreign matter such as moisture, oxygen, and dust particles. The encapsulation layer 140 may include at least one inorganic layer. The encapsulation layer 140 may include a laminated structure of an inorganic layer/an organic layer/an inorganic layer.

The sensor layer 200 may be disposed on the display panel 100. The sensor layer 200 may sense an external input applied from the outside. The external input may be a user's input. The user's input may include various types of external inputs, such as a part of a user's body, light, heat, a pen, and pressure.

The sensor layer 200 may be provided on the display panel 100 through a continuous process. In this case, the sensor layer 200 may be directly disposed on the display panel 100. When the sensor layer 200 is directly disposed on the display panel 100, a component is not disposed between the sensor layer 200 and the display panel 100. That is, a separate adhesive member may not be disposed between the sensor layer 200 and the display panel 100.

The anti-reflection layer 300 may be directly disposed on the sensor layer 200. The anti-reflection layer 300 may reduce the degree of reflection of external light incident from outside of the display device DD. The anti-reflection layer 300 may be provided on the sensor layer 200 through a continuous process. The anti-reflection layer 300 may include color filters. The color filters may have a predetermined arrangement. For example, the color filters may be arranged in consideration of emission colors of the pixels included in the display panel 100. In addition, the anti-reflection layer 300 may further include a black matrix adjacent to the color filters. A detailed description of the anti-reflection layer 300 will be provided later.

In an embodiment of the inventive concept, the sensor layer 200 is omitted. In this case, the anti-reflection layer 300 may be directly disposed on the display panel 100. In an embodiment of the inventive concept, the positions of the sensor layer 200 and the anti-reflection layer 300 may be interchanged.

Although not illustrated, an optical layer disposed on the anti-reflection layer 300 may be further included in the display device DD in an embodiment of the inventive concept. For example, the optical layer may be provided on the anti-reflection layer 300 through a continuous process. The optical layer may control the direction of light incident from the display panel 100 to increase front luminance of the display device DD. For example, the optical layer may include an organic insulating layer in which openings are defined to respectively correspond to emission areas of the pixels included in the display panel 100, and a high refractive index layer may be present covering the organic insulating layer and filling the openings. In an embodiment, the high refractive index layer has a higher refractive index than the organic insulating layer.

Figure 4:
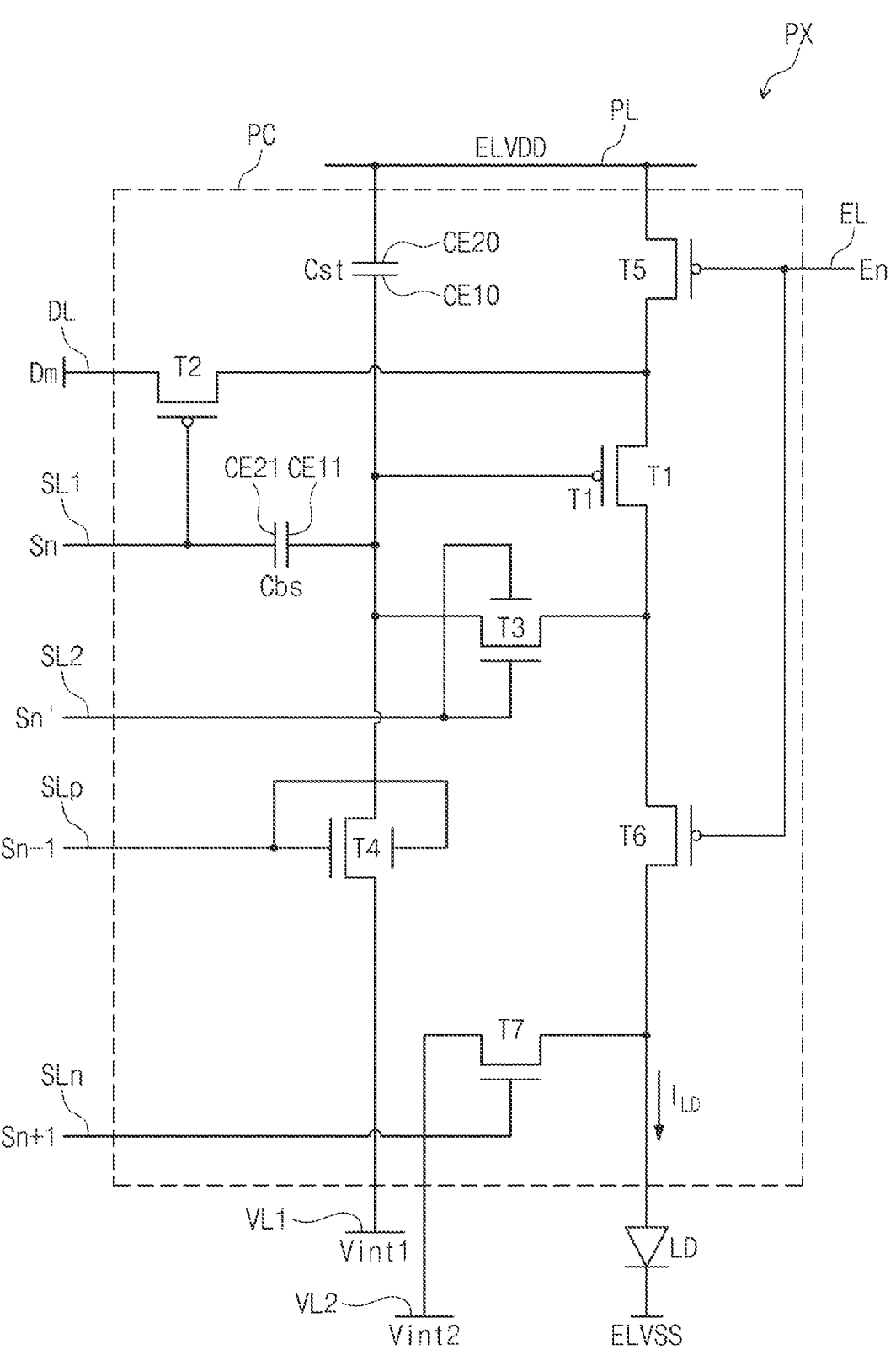
FIG. 4 is an equivalent circuit diagram of each of pixels according to an embodiment of the inventive concept.

FIG. 4 is an equivalent circuit diagram of each of the pixels PX according to an embodiment of the inventive concept.

Referring to FIG. 4, an equivalent circuit diagram of one pixel PX of the plurality of pixels PX illustrated in FIG. 2 is illustrated. The pixel PX may include a light emitting element LD and a pixel circuit PC. The light emitting element LD may be a component included in the light emitting element layer 130 of FIG. 3, and the pixel circuit PC may be a component included in the circuit layer 120 of FIG. 3.

The pixel circuit PC may include a plurality of thin film transistors T1 to T7 and a storage capacitor Cst. The plurality of thin film transistors T1 to T7 and the storage capacitor Cst may be electrically connected to signal lines SL1, SL2, SLp, SLn, EL, and DL, a first initialization voltage line VL1, a second initialization voltage line VL2 (or an anode initialization voltage line VL2), and a driving voltage line PL.

The plurality of thin film transistors T1 to T7 may include a driving thin film transistor T1 (or a first thin film transistor T1), a switching thin film transistor T2 (or a second thin film transistor T2), a compensation thin film transistor T3 (or a third thin film transistor T3), a first initialization thin film transistor T4 (or a fourth thin film transistor T4), an operation control thin film transistor T5 (or a fifth thin film transistor T5), an emission control thin film transistor T6 (or a sixth thin film transistor T6), and a second initialization thin film transistor T7 (or a seventh thin film transistor T7).

The light emitting element LD may include a first electrode (e.g., an anode electrode or a pixel electrode) and a second electrode (e.g., a cathode electrode or a common electrode), and the first electrode of the light emitting element LD may be connected to the driving thin film transistor T1 via the emission control thin film transistor T6 to receive a driving current $I_{LD}$, and the second electrode may receive a low power source voltage ELVSS. The light emitting element LD may generate light having luminance corresponding to the driving current $I_{LD}$.

Some of the plurality of thin film transistors T1 to T7 may be n-channel MOSFETs (NMOS), and the rest thereof may be p-channel MOSFETs (PMOS). For example, the compensation thin film transistor T3 and the first initialization thin film transistor T4 of the plurality of thin film transistors T1 to T7 may be n-channel MOSFETs (NMOS), and the rest thereof may be p-channel MOSFETs (PMOS).

According to an embodiment of the inventive concept, the compensation thin film transistor T3, the first initialization thin film transistor T4, and the second initialization thin film transistor T7 of the plurality of thin film transistors T1 to T7 may be NMOSs, and the rest thereof may be PMOSs. According to an embodiment of the inventive concept, only one of the plurality of thin film transistors T1 to T7 may be an NMOS, and the rest thereof may be PMOSs. According to an embodiment of the inventive concept, all of the plurality of thin film transistors T1 to T7 may be NMOSs, or all thereof may be PMOSs.

The signal lines may include a first present scan line SL1 transmitting a first scan signal Sn, a second present scan line SL2 transmitting a second scan signal Sn', a prior scan line SLp transmitting a prior scan signal Sn-1 to the first initialization thin film transistor T4, an emission control line EL transmitting an emission control signal En to the operation control thin film transistor T5 and the emission control thin film transistor T6, a next scan line SLn transmitting a next scan signal Sn+1 to the second initialization thin film transistor T7, and a data line DL that crosses the first present scan line SL1 and transmits a data signal Dm.

The driving voltage line PL may transmit a driving voltage ELVDD to the driving thin film transistor T1, and the first initialization voltage line VL1 may transmit an initialization voltage Vint1 for initializing the driving thin film transistor T1 and the first electrode of the light emitting element LD.

A gate of the driving thin film transistor T1 may be connected to the storage capacitor Cst, a source of the driving thin film transistor T1 may be connected to the driving voltage line PL via the operation control thin film transistor T5, and a drain of the driving thin film transistor T1 may be electrically connected to the first electrode of the light emitting element LD via the emission control thin film transistor T6. The driving thin film transistor T1 may receive the data signal Dm according to a switching operation of the switching thin film transistor T2 to supply the driving current $I_{LD}$ to the light emitting element LD.

A gate of the switching thin film transistor T2 may be connected to the first present scan line SL1 transmitting the first scan signal Sn, a source of the switching thin film transistor T2 may be connected to the data line DL, and a drain of the switching thin film transistor T2 may be connected to the source of the driving thin film transistor T1 and connected to the driving voltage line PL via the operation control thin film transistor T5. The switching thin film transistor T2 may perform the switching operation in which the switching thin film transistor T2 is turned on according to the first scan signal Sn transmitted through the first present scan line SL1 and transmits, to the source of the driving thin film transistor T1, the data signal Dm transmitted through the data line DL.

A gate of the compensation thin film transistor T3 is connected to the second present scan line SL2. A drain of the compensation thin film transistor T3 may be connected to the drain of the driving thin film transistor T1 and connected to the first electrode of the light emitting element LD via the emission control thin film transistor T6. A source of the compensation thin film transistor T3 may be connected to a first electrode CE10 of the storage capacitor Cst and the gate of the driving thin film transistor T1. In addition, the source of the compensation thin film transistor T3 may be connected to a drain of the first initialization thin film transistor T4.

The compensation thin film transistor T3 may be turned on according to the second scan signal Sn' received through the second present scan line SL2 and may electrically connect the gate and the drain of the driving thin film transistor T1 to diode-connect the driving thin film transistor T1.

A gate of the first initialization thin film transistor T4 may be connected to the prior scan line SLp. A source of the first initialization thin film transistor T4 may be connected to a source of the second initialization thin film transistor T7 and the first initialization voltage line VL1. The drain of the first initialization thin film transistor T4 may be connected to the first electrode CE10 of the storage capacitor Cst, the source of the compensation thin film transistor T3, and the gate of the driving thin film transistor T1. The first initialization thin film transistor T4 may be turned on according to the prior scan signal Sn-1 received through the prior scan line SLp and may perform an initialization operation in which the first initialization thin film transistor T4 transmits the initialization voltage Vint1 to the gate of the driving thin film transistor T1 to initialize the voltage of the gate of the driving thin film transistor T1.

A gate of the operation control thin film transistor T5 may be connected to the emission control line EL, a source of the operation control thin film transistor T5 may be connected to the driving voltage line PL, and a drain of the operation control thin film transistor T5 may be connected to the source of the driving thin film transistor T1 and the drain of the switching thin film transistor T2.

A gate of the emission control thin film transistor T6 may be connected to the emission control line EL, a source of the emission control thin film transistor T6 may be connected to the drain of the driving thin film transistor T1 and the drain of the compensation thin film transistor T3, and a drain of the emission control thin film transistor T6 may be electrically connected to a drain of the second initialization thin film transistor T7 and the first electrode of the light emitting element LD.

The operation control thin film transistor T5 and the emission control thin film transistor T6 are simultaneously turned on according to the emission control signal En received through the emission control line EL and allow the driving current $I_{LD}$ to flow through the light emitting element LD by providing the driving voltage ELVDD to the light emitting element LD.

A gate of the second initialization thin film transistor T7 may be connected to the next scan line SLn, the drain of the second initialization thin film transistor T7 may be connected to the drain of the emission control thin film transistor T6 and the first electrode of the light emitting element LD, and the source of the second initialization thin film transistor T7 may be connected to the second initialization voltage line VL2 to receive an anode initialization voltage Vint2. The second initialization thin film transistor T7 is turned on according to the next scan signal Sn+1 transmitted through the next scan line SLn and initializes the first electrode of the light emitting element LD.

In an embodiment, the second initialization thin film transistor T7 may be connected to the emission control line EL to be driven according to the emission control signal En. Meanwhile, positions of the source and the drain may be interchanged according to the type (a p-type or an n-type) of the transistor.

The storage capacitor Cst may include the first electrode CE10 and a second electrode CE20. The first electrode CE10 of the storage capacitor Cst is connected to the gate of the driving thin film transistor T1, and the second electrode CE20 of the storage capacitor Cst is connected to the driving voltage line PL. The storage capacitor Cst may store electric charges corresponding to a difference between the voltage of the gate of the driving thin film transistor T1 and the driving voltage ELVDD.

A boosting capacitor Cbs may include a first electrode CE11 and a second electrode CE21. The first electrode CE11 of the boosting capacitor Cbs may be connected to the first electrode CE11 of the storage capacitor Cst, and the second electrode CE21 of the boosting capacitor Cbs may receive the first scan signal Sn. The boosting capacitor Cbs may compensate for the voltage drop of the gate of the driving thin film transistor T1 by increasing the voltage of the gate at the point in time when the provision of the first scan signal Sn is stopped.

A detailed operation of each of the pixels PX according to an embodiment is as follows.

During an initialization period, when the prior scan signal Sn-1 is provided through the prior scan line SLp, the first initialization thin film transistor T4 is turned on in response to the prior scan signal Sn-1, and the driving thin film transistor T1 is initialized by the initialization voltage Vint1 provided from the first initialization voltage line VL1.

During a data programming period, when the first scan signal Sn and the second scan signal Sn' are provided through the first present scan line SL1 and the second present scan line SL2, respectively, the switching thin film transistor T2 and the compensation thin film transistor T3 are turned on in response to the first scan signal Sn and the second scan signal Sn', respectively. In an embodiment, the driving thin film transistor T1 is diode-connected by the turned-on compensation thin film transistor T3 and is forward-biased.

Then, a compensation voltage Dm+Vth (here, Vth is a negative value), which is obtained by adding the data signal Dm provided from the data line DL and a threshold voltage Vth of the driving thin film transistor T1, is applied to the gate of the driving thin film transistor T1.

The driving voltage ELVDD and the compensation voltage Dm+Vth are respectively applied to both ends of the storage capacitor Cst, and electric charges corresponding to the voltage difference between both ends are stored in the storage capacitor Cst.

During an emission period, the operation control thin film transistor T5 and the emission control thin film transistor T6 are turned on by the emission control signal En provided from the emission control line EL. The driving current $I_{LD}$ according to a voltage difference between the voltage of the gate of the driving thin film transistor T1 and the driving voltage ELVDD is generated and supplied to the light emitting element LD through the emission control thin film transistor T6.

In this embodiment, at least one of the plurality of thin film transistors T1 to T7 includes a semiconductor layer including oxide, and the others thereof include a semiconductor layer including silicon.

Specifically, the driving thin film transistor T1, which directly affects the brightness of the display device, may be implemented to include a semiconductor layer made of polycrystalline silicon having high reliability, thereby implementing a high-resolution display device.

Meanwhile, due to high carrier mobility and a low leakage current of an oxide semiconductor, the voltage drop of the oxide semiconductor is not large even when the driving time is long. That is, the oxide semiconductor is capable of low-frequency driving because the color change of an image caused by the voltage drop is not big even during the low-frequency driving.

Because the oxide semiconductor has a low leakage current as described above, by employing the oxide semiconductor for one or more of the compensation thin film transistor T3, the first initialization thin film transistor T4, and the second initialization thin film transistor T7 that are connected to the gate of the driving thin film transistor T1, it is possible to prevent a leakage current that may flow into the gate of the driving thin film transistor T1, and at the same time, reduce power consumption.

Figure 5:
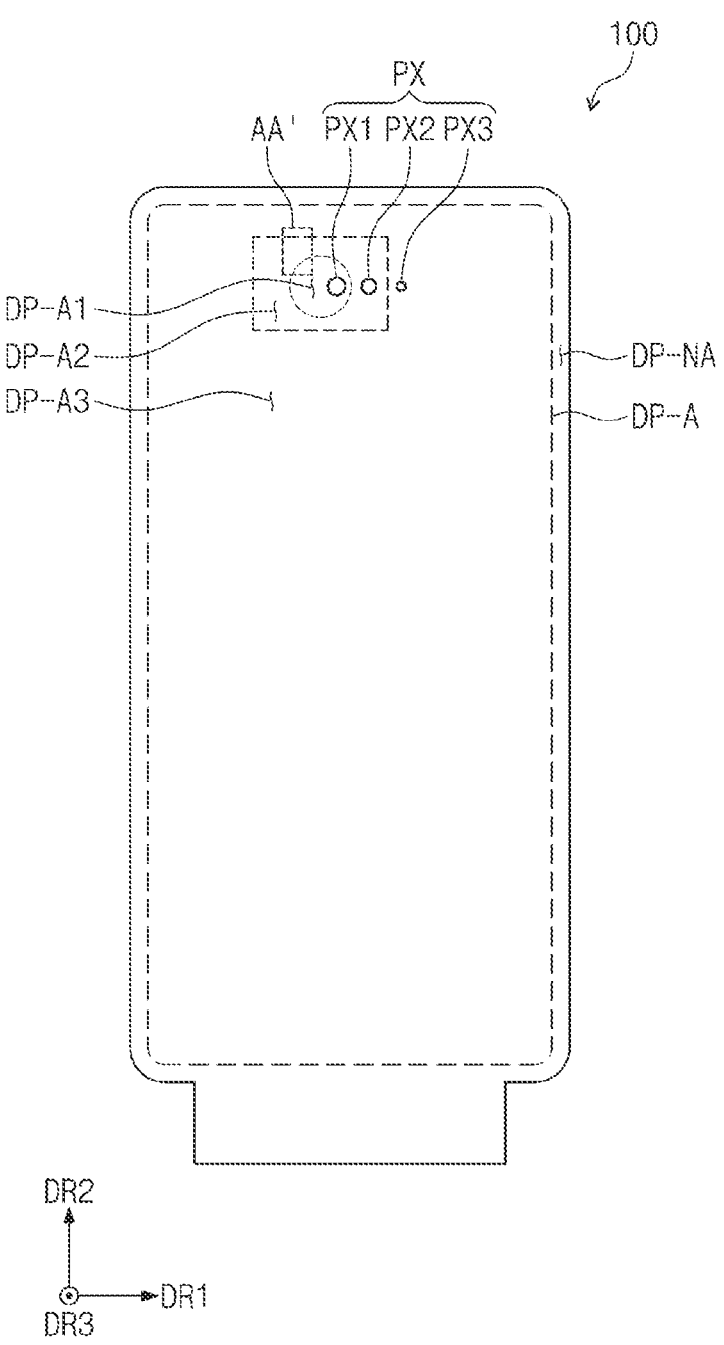
FIG. 5 is a plan view of a display panel according to an embodiment of the inventive concept.
Figure 6A:
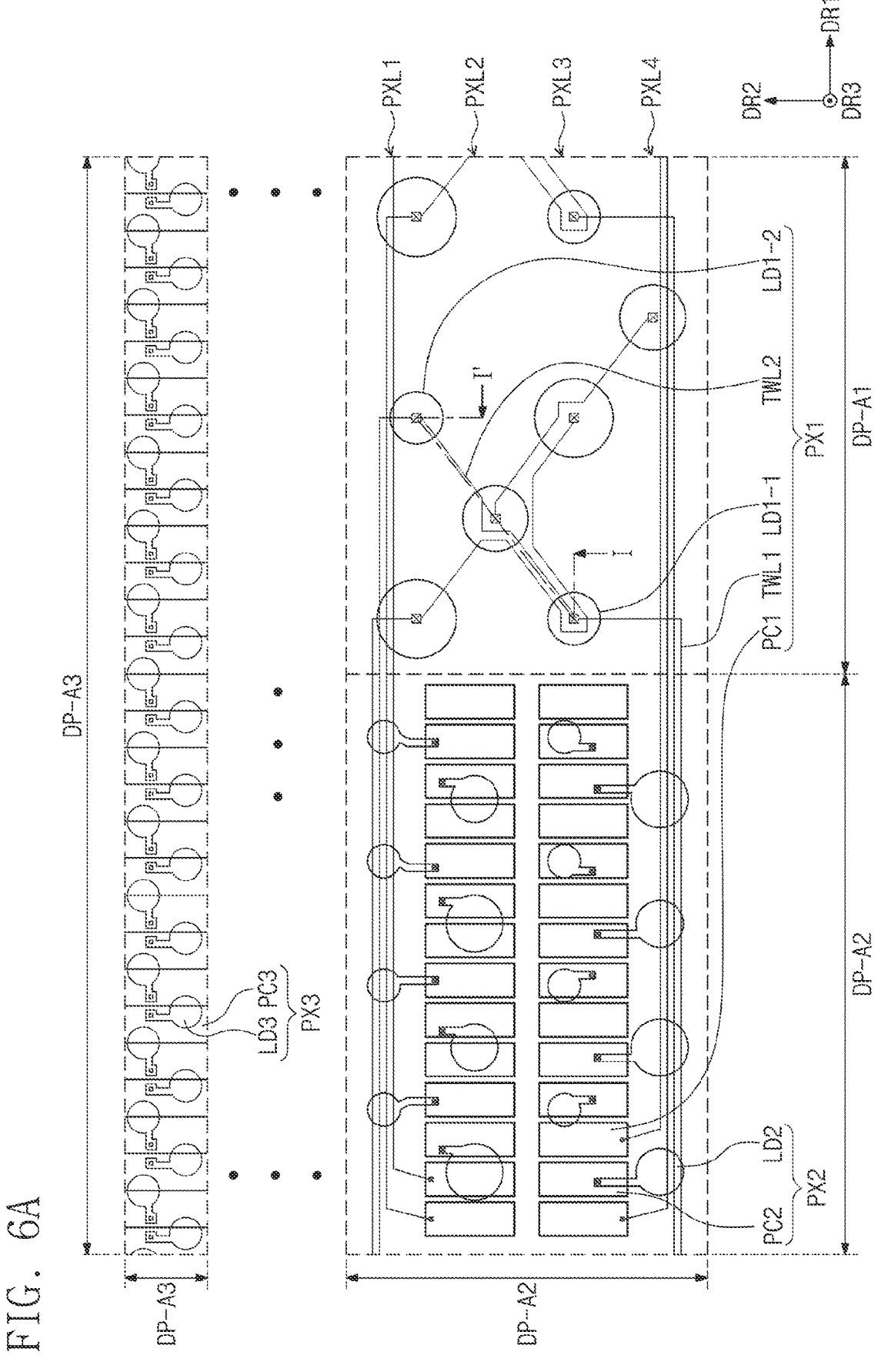
FIG. 6A is an enlarged plan view illustrating area AN of FIG. 5.

FIG. 5 is a plan view of the display panel 100 according to an embodiment of the inventive concept. FIG. 6A is an enlarged plan view illustrating area AA' of FIG. 5.

Referring to FIGS. 5 and 6A, the display panel 100 may include a display area DP-A and a peripheral area DP-NA. The peripheral area DP-NA may be adjacent to the display area DP-A and may surround at least a portion of the display area DP-A. The peripheral area DP-NA may correspond to the peripheral area 100N of FIG. 3.

The display area DP-A may include a first area DP-A1, a second area DP-A2, and a third area DP-A3. The first area DP-A1 may overlap (or correspond to) the sensing area 1000SA illustrated in FIG. 1 or the sensing area 100SA illustrated in FIG. 2. Although illustrated as a circular shape in this embodiment, the first area DP-A1 may have various shapes such as a polygon, an ellipse, a shape having at least one curved side, and an atypical shape, but is not limited thereto.

The second area DP-A2 is adjacent to the first area DP-A1. The second area DP-A2 may surround at least a portion of the first area DP-A1. The second area DP-A2 may be spaced apart from the peripheral area DP-NA. However, the second area DP-A2 is not limited thereto and may be in contact with the peripheral area DP-NA.

The third area DP-A3 is adjacent to the second area DP-A2. The third area DP-A3 may surround at least a portion of the second area DP-A2. The third area DP-A3 may be in contact with the peripheral area DP-NA. However, the third area DP-A3 is not limited thereto and may be spaced apart from the peripheral area DP-NA.

The display panel 100 may include the plurality of pixels PX. The display panel 100 may include a first pixel PX1 including a light emitting element disposed in the first area DP-A1, a second pixel PX2 including a light emitting element disposed in the second area DP-A2, and a third pixel PX3 including a light emitting element disposed in the third area DP-A3. Each of the first pixel PX1, the second pixel PX2, and the third pixel PX3 may include the pixel circuit PC illustrated in FIG. 4.

Each of the first pixel PX1, the second pixel PX2, and the third pixel PX3 may be provided in plurality. In this case, each of the first to third pixels PX1, PX2, and PX3 may include a red pixel, a green pixel, and a blue pixel, and may further include a white pixel according to an embodiment.

The first area DP-A1, the second area DP-A2, and the third area DP-A3 may be divided on the basis of light transmittance or resolution. The light transmittance and the resolution may be measured in a reference surface area.

In an embodiment, the first area DP-A1 has a light transmittance higher than those of the second area DP-A2 and the third area DP-A3. This is because the first area DP-A1 has a lower ratio of a surface area occupied by a light blocking structure to be described later to the reference surface area than each of the second area DP-A2 and the third area DP-A3 has. The light blocking structure may include the conductive pattern of the circuit layer, a pixel defining film, a pixel defining pattern, and the like, which will be described later.

In an embodiment, the third area DP-A3 has a higher resolution than the first area DP-A1 and the second area DP-A2. For example, in this embodiment, in the third area DP-A3, a larger number of light emitting elements are disposed in the reference surface area (or the same surface area) as compared with the first area DP-A1 and the second area DP-A2.

When divided on the basis of light transmittance, the first area DP-A1 may be a first transmittance area, and the second area DP-A2 and the third area DP-A3 may be different portions of a second transmittance area distinguished from the first transmittance area. The transmittance of the second area DP-A2 and the third area DP-A3 may be substantially the same. Even when the transmittance of the second area DP-A2 is not the same as the transmittance of the third area DP-A3, the second area DP-A2 and the third area DP-A3 may be defined as the second transmittance area when the first area DP-A1 is defined as the first transmittance area because the transmittance of the first area DP-A1 is significantly higher than the transmittance of each of the second area DP-A2 and the third area DP-A3.

When divided on the basis of resolution, the first area DP-A1 and the second area DP-A2 may be different portions of a first resolution area, and the third area DP-A3 may be a second resolution area distinguished from the first resolution area. In an embodiment, the number of light emitting elements per the reference surface area of the first area DP-A1 is substantially the same as the number of light emitting elements per the reference surface area of the second area DP-A2.

Referring to FIG. 6A, the first pixel PX1 includes a first light emitting element LD1-1 of a first group and a first pixel circuit PC1 electrically connected to the first light emitting element LD1-1 of the first group. The first pixel circuit PC1 is for driving the first light emitting element LD1-1 of the first group and is disposed in the second area DP-A2.

In an embodiment, the first pixel PX1 further includes a second light emitting element LD1-2 of the first group. The second light emitting element LD1-2 of the first group may be electrically connected to the first light emitting element LD1-1 of the first group or may be driven separately from the first light emitting element LD1-1 of the first group. When the second light emitting element LD1-2 of the first group is driven separately from the first light emitting element LD1-1 of the first group, the second light emitting element LD1-2 of the first group may be connected to a separate pixel circuit disposed in the second area DP-A2 instead of the first pixel circuit PC1.

FIG. 6A illustrates, as an example, a case where the second light emitting element LD1-2 of the first group is electrically connected to the first light emitting element LD1-1 of the first group, and thus the first pixel circuit PC1 drives the first light emitting element LD1-1 of the first group and the second light emitting element LD1-2 of the first group. However, embodiments of the inventive concept are not limited thereto. For example, the first pixel PX1 may further include an additional light emitting element electrically connected to the second light emitting element LD1-2 of the first group, and the first pixel circuit PC1 may drive, for example, one or more light emitting elements sequentially connected to the second light emitting element LD1-2 of the first group.

The second pixel PX2 may include a light emitting element LD2 of a second group and a second pixel circuit PC2 for driving the light emitting element LD2 of the second group. The third pixel PX3 may include a light emitting element LD3 of a third group and a third pixel circuit PC3 for driving the light emitting element LD3 of the third group.

The first pixel PX1, the second pixel PX2, and the third pixel PX3 illustrated in FIG. 6A are illustrated on the basis of the positions of the corresponding light emitting elements LD1-1, LD1-2, LD2, and LD3. In FIG. 6A, first electrodes of the light emitting elements are illustrated to respectively represent the light emitting elements LD1-1 and LD1-2 of the first group, the light emitting element LD2 of the second group, and the light emitting element LD3 of the third group.

To increase the transmittance of the first area DP-A1 by removing the light blocking structure such as a transistor, the first pixel circuit PC1 may be disposed in the second area DP-A2 or the peripheral area DP-NA instead of the first area DP-A1. An area in the first area DP-A1 in which the light emitting elements LD1-1 and LD1-2 of the first group are not disposed may be defined as a transmissive area. For example, an area in the first area DP-A1 in which the first electrodes of the light emitting elements LD1-1 and LD1-2 of the first group are not disposed may be defined as the transmissive area.

To secure an area in the second area DP-A2 in which the first pixel circuit PC1 is to be disposed, fewer light emitting elements LD2 of the second group are disposed in the reference surface area than the light emitting elements LD3 of the third group are disposed therein. The first pixel circuit PC1 is disposed in an area in the second area DP-A2 in which the second pixel circuit PC2 is not disposed.

The first light emitting element LD1-1 of the light emitting elements LD1-1 and LD1-2 of the first group may be electrically connected to the first pixel circuit PC1 through a first connection line TWL1. The second light emitting element LD1-2 of the light emitting elements LD1-1 and LD1-2 of the first group may be electrically connected to the first light emitting element LD1-1 through a second connection line TWL2. Each of the first connection line TWL1 and the second connection line TWL2 may be provided in plurality. As a result, the second light emitting element LD1-2 may be electrically connected to the first pixel circuit PC1 through the first light emitting element LD1-1. A detailed description thereof will be provided later.

Each of the first connection line TWL1 and the second connection line TWL2 may overlap the transmissive area of the first area DP-A1. In an embodiment, each of the first and second connection lines TWL1 and TWL2 includes or entirely includes a transparent conductive material. For example, each of the first and second connection lines TWL1 and TWL2 may include transparent conductive oxide (TCO) such as indium tin oxide (ITO), indium zinc oxide (IZO), indium gallium zinc oxide (IGZO), zinc oxide (ZnO), and indium oxide ($In_2O_3$). The first connection line TWL1 and the second connection line TWL2 including the transparent conductive materials do not correspond to the light blocking structure.

An additional pixel circuit for independently driving the second light emitting element LD1-2 is not required, and the two light emitting elements LD1-1 and LD1-2 or more are driven by the first pixel circuit PC1, thereby increasing freedom of design of the first area DP-A1 and the second area DP-A2. In addition, the number of first connection lines TWL1 overlapping the first area DP-A1 and the second area DP-A2 may be reduced. As the number of the first pixel circuits PC1 disposed in the second area DP-A2 decreases, a space for disposing the signal line may be secured.

In an embodiment, the second area DP-A2 has lower transmittance than the first area DP-A1. This is because the second area DP-A2 has a higher ratio of a surface area occupied by the light blocking structure to be described later to the reference surface area than the first area DP-A1 has. The first pixel circuit PC1, the light emitting element LD2 of the second group, and the second pixel circuit PC2 may be disposed in the second area DP-A2. Since the first pixel circuits PC1 are disposed in the second area DP-A2, an area in the second area DP-A2 in which the second pixel circuits PC2 are to be disposed has a reduced surface area, and as a result, the resolution of the second area DP-A2 becomes lower than that of the third area DP-A3.

A pixel circuit not connected to the first connection line TWL1 or the light emitting element LD2 of the second group in the second area DP-A2 substantially corresponds to one first pixel circuit PC1 of the first pixel circuits PC1. However, because only some of the first light emitting elements LD1-1 are illustrated in FIG. 6A, a corresponding first connection line TWL1 to be connected to the one first pixel circuit PC1 is not illustrated.

In an embodiment, the third area DP-A3 has a lower transmittance than the first area DP-A1. The third light emitting element LD3 and the third pixel circuit PC3 may be disposed in the third area DP-A3.

First to fourth light emitting element rows PXL1 to PXL4 may be defined in the first area DP-A1. In each of the first and third light emitting element rows PXL1 and PXL3, blue light emitting elements emitting blue light and red light emitting elements emitting red light are alternately arranged in the first direction DR1. In each of the second and fourth light emitting element rows PXL2 and PXL4, green light emitting elements emitting green light and red light emitting elements emitting red light are alternately arranged in the first direction DR1. In an embodiment, each of first electrodes of the blue light emitting elements have a larger surface area than a first electrode of each of the red and green light emitting elements. In the second direction DR2, the blue light emitting elements of the first light emitting element row PXL1 are respectively aligned with the red light emitting elements of the third light emitting element row PXL3, and the red light emitting elements of the first light emitting element row PXL1 are respectively aligned with the blue light emitting elements of the third light emitting element row PXL3.

In the second area DP-A2, green light emitting elements emitting green light are arranged in the first direction DR1 in each of the first and third light emitting element rows PXL1 and PXL3. In each of the second and fourth light emitting element rows PXL2 and PXL4, blue light emitting elements emitting blue light and red light emitting elements emitting red light are alternately arranged in the first direction DR1. In the second direction DR2, the red light emitting elements of the second light emitting element row PXL2 are respectively aligned with the blue light emitting elements of the fourth light emitting element row PXL4. In an embodiment, each of first electrodes of the blue light emitting elements have a larger surface area than a first electrode of each of the red and green light emitting elements.

First electrodes each having a surface area smaller than those of the first electrodes in the first area DP-A1 and the second area DP-A2 are illustrated in the third area DP-A3. Also in the third area DP-A3, first to fourth light emitting element rows corresponding to the first to fourth light emitting element rows PXL1 to PXL4 may constitute a group and may be repeatedly arranged in the second direction DR2.

Figure 6B:
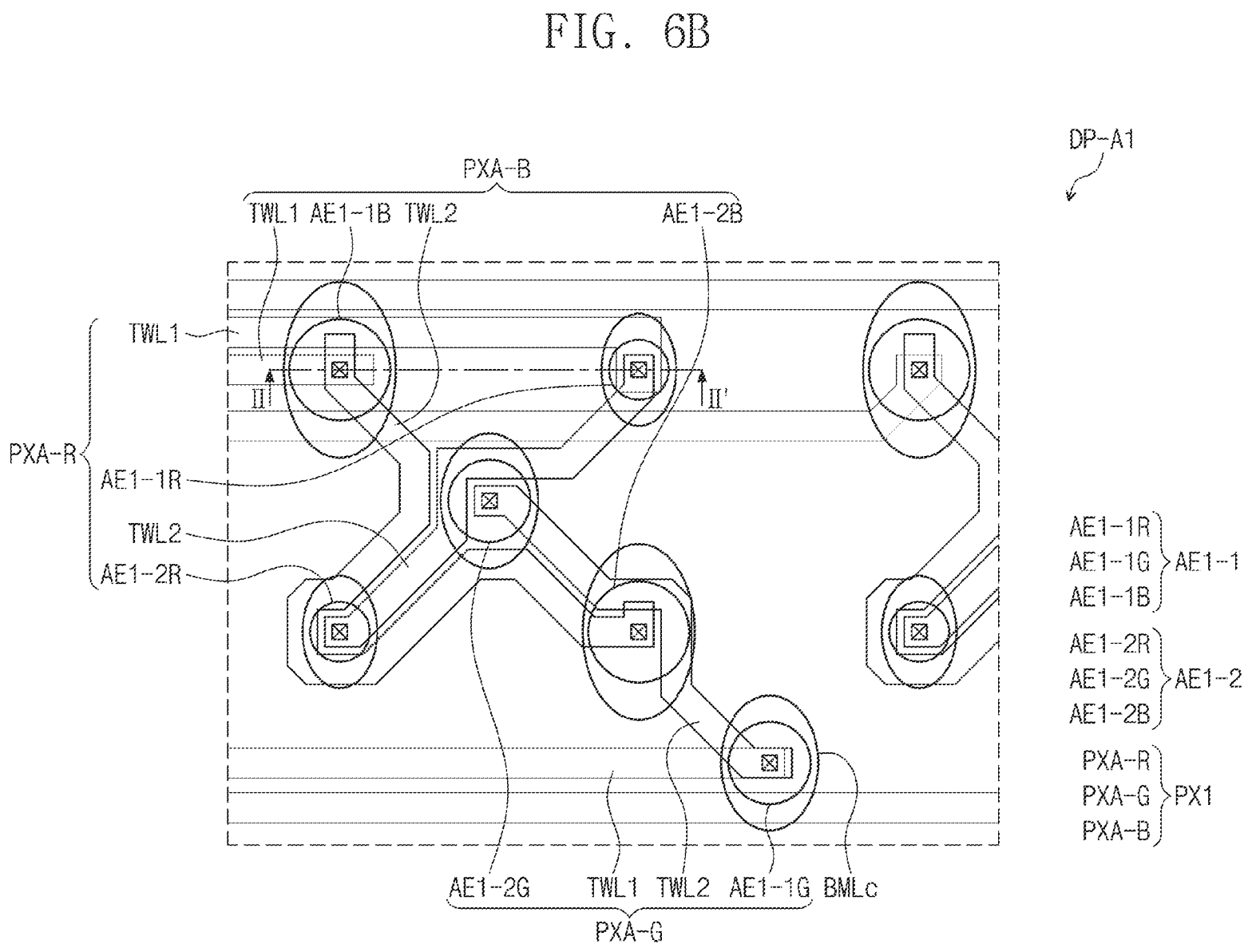

FIG. 6B is an enlarged plan view illustrating a portion of the first area DP-A1 of FIG. 6A.

The first pixels PX1 of three colors are illustrated in FIG. 6B. The first pixels PX1 may include a first color pixel PXA-R, a second color pixel PXA-G, and a third color pixel PXA-B that generate light of different colors. Although the first color may be red, the second color may be green, and the third color may be blue, the first to third colors are not limited thereto and may be three other colors. In FIG. 6B, (1-1)-th electrodes AE1-1 (or first pixel electrodes AE1-1) are illustrated to represent the first light emitting elements LD1-1 (see FIG. 6A). In FIG. 6B, (1-2)-th electrodes AE1-2 (or second pixel electrodes AE1-2) are illustrated to represent the second light emitting elements LD1-2 (see FIG. 6A).

The first color pixel PXA-R may include a (1-1)-th electrode AE1-1R, a (1-2)-th electrode AE1-2R, a corresponding one of the first connection lines TWL1 connecting the (1-1)-th electrode AE1-1R and a corresponding one of the first pixel circuits PC1 (see FIG. 6A), and a corresponding one of the second connection lines TWL2 connecting the (1-1)-th electrode AE1-1R and the (1-2)-th electrode AE1-2R.

The second color pixel PXA-G may include a (1-1)-th electrode AE1-1G, a (1-2)-th electrode AE1-2G, a corresponding one of the first connection lines TWL1 connecting the (1-1)-th electrode AE1-1G and a corresponding one of the first pixel circuits PC1 (see FIG. 6A), and a corresponding one of the second connection lines TWL2 connecting the (1-1)-th electrode AE1-1G and the (1-2)-th electrode AE1-2G.

The third color pixel PXA-B may include a (1-1)-th electrode AE1-1B, a (1-2)-th electrode AE1-2B, a corresponding one of the first connection lines TWL1 connecting the (1-1)-th electrode AE1-1B and a corresponding one of the first pixel circuits PC1 (see FIG. 6A), and a corresponding one of the second connection lines TWL2 connecting the (1-1)-th electrode AE1-1B and the (1-2)-th electrode AE1-2B.

Each of the (1-1)-th electrodes AE1-1 and the (1-2)-th electrodes AE1-2 may be referred to as a first electrode.

Because FIG. 6B is an enlarged view of the first area DP-A1, the corresponding first pixel circuit PC1 included in each of the first color pixel PXA-R, the second color pixel PXA-G, and the third color pixel PXA-B is not illustrated in the drawing. However, each of the first color pixel PXA-R, the second color pixel PXA-G, and the third color pixel PXA-B further includes the corresponding first pixel circuit PC1 connected through the corresponding first connection line TWL1 and disposed in the second area DP-A2 (see FIG. 6A).

Light blocking patterns BMLc overlapping the (1-1)-th electrodes AE1-1 and the (1-2)-th electrodes AE1-2 when viewed in a plane may be further disposed in the first area DP-A1. The light blocking patterns BMLc may be disposed on lower portions of the (1-1)-th electrodes AE1-1 and the (1-2)-th electrodes AE1-2. In an exemplary embodiment, when viewed in a plane or a plan view, a surface area of each of the light blocking patterns BMLc is larger than a surface area of each of the (1-1)-th electrodes AE1-1 and the (1-2)-th electrodes AE1-2. In addition, when viewed in a plane or a plan view, the light blocking patterns BMLc are spaced apart from each other and do not extend from the (1-1)-th electrodes AE1-1 to the (1-2)-th electrodes AE1-2. A detailed description of the light blocking pattern BMLc will be provided later.

Figure 6C:
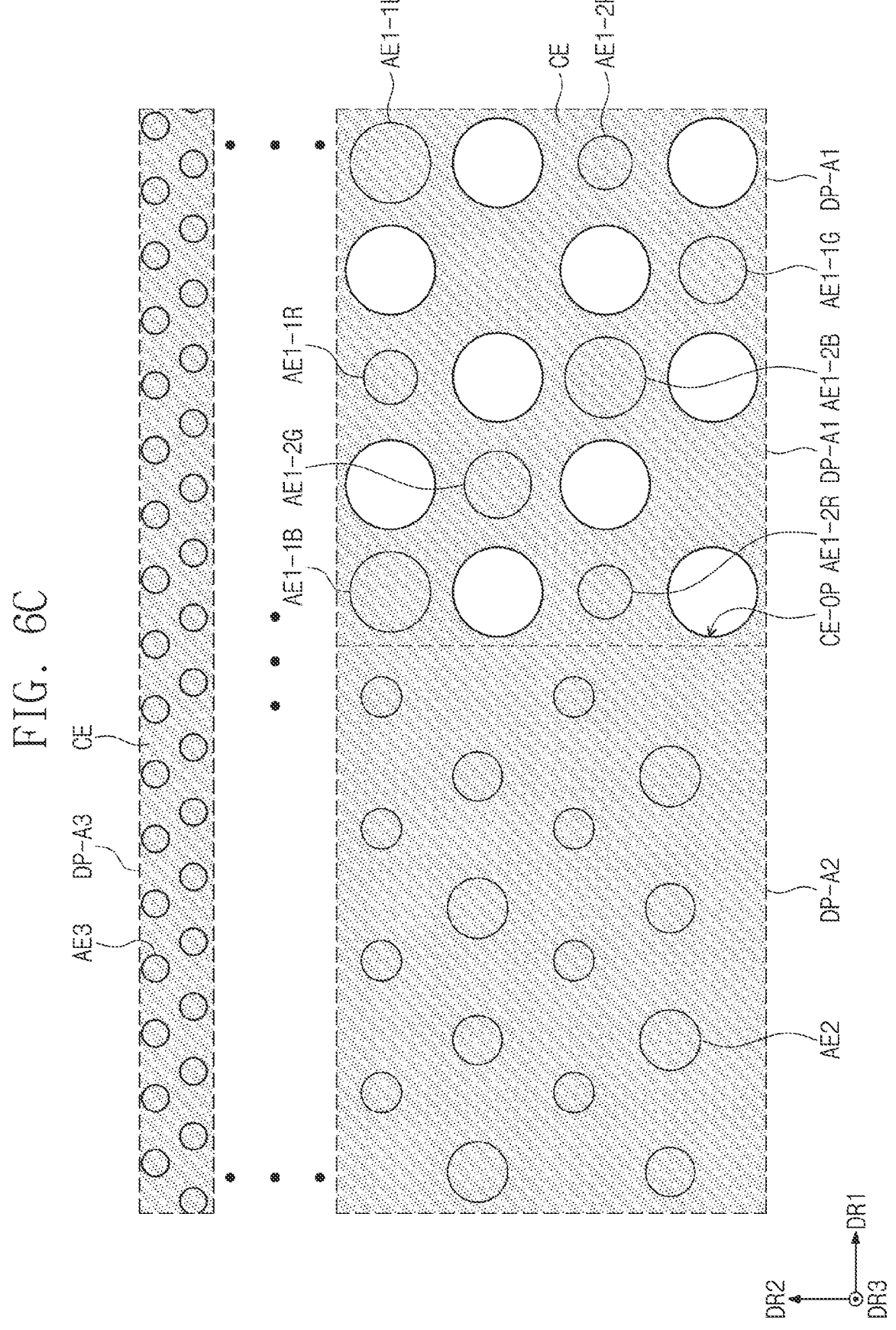
FIG. 6C is an enlarged plan view illustrating the area AA' of FIG. 5.

FIG. 6C is an enlarged plan view illustrating the area AA' of FIG. 5.

FIG. 6C illustrates the first electrodes AE1-1R, AE1-1G, AE1-1B, AE1-2R, AE1-2G, and AE1-2B, and first electrodes AE2 and AE3 to represent the light emitting elements LD1-1, LD1-2, LD2, and LD3 illustrated in FIG. 6A. In addition, a second electrode CE (or a common electrode CE) included in the light emitting elements LD1-1, LD1-2, LD2, and LD3 is illustrated together.

Referring to FIG. 6C, the second electrode CE may be provided in common to the first light emitting element LD1-1 of the first group, the second light emitting element LD1-2 of the first group, the light emitting element LD2 of the second group, and the light emitting element LD3 of the third group. For example, the second electrode CE may have an integral shape in the first area DP-A1, the second area DP-A2, and the third area DP-A3. For example, the second electrode CE may be a single continuous layer throughout the first area DP-A1, the second area DP-A2, and the third area DP-A3.

In an embodiment, electrode openings CE-OP are defined in the second electrode CE to secure or increase the transmittance of the first area DP-A1 for an optical signal. In an embodiment, the electrode openings CE-OP are through holes that pass entirely through the second electrode CE. An optical signal may pass through the electrode openings CE-OP. The transmittance of the first area DP-A1 may be further increased by adjusting the sizes and/or the number of the electrode openings CE-OP. In an embodiment, the electrode openings CE-OP are not disposed in the second area DP-A2 and the third area DP-A3. For example, the second electrode CE may be disposed in the entirety of the second area DP-A2 and the third area DP-A3.

In the first area DP-A1, the electrode openings CE-OP may be disposed between the first electrodes AE1-1R, AE1-1G, AE1-1B, AE1-2R, AE1-2G, and AE1-2B. For example, one of the electrode openings CE-OP may be disposed between the (1-1)-th electrode AE1-1B and a corresponding (1-2)-th electrode AE1-2R. For example, one of the electrode openings CE-OP may be disposed between the (1-1)-th electrode AE1-1B and a corresponding (1-1)-th electrode AE1-1R. For example, one of the electrode openings CE-OP may be disposed between the (1-2)-th electrode AE1-2R and a corresponding (1-2)-th electrode AE1-2B. The positions of the electrode openings CE-OP are not particularly limited and may be variously disposed between the first electrodes AE1-1R, AE1-1G, AE1-1B, AE1-2R, AE1-2G, and AE1-2B.

In the first area DP-A1, the second electrode CE overlaps each of the first electrodes AE1-1R, AE1-1G, AE1-1B, AE1-2R, AE1-2G, and AE1-2B, and is disposed between a tuple selected from the first electrodes AE1-1R, AE1-1G, AE1-1B, AE1-2R, AE1-2G, and AE1-2B, although the electrode openings CE-OP are defined in the second electrode CE.

Referring to FIGS. 6A and 6C, the second electrode CE may extend from the first light emitting element LD1-1 of the first group to the second light emitting element LD1-2 of the first group, and may be provided in common to the first light emitting element LD1-1 of the first group and the second light emitting element LD1-2 of the first group. In addition, the second electrode CE may extend from the first light emitting element LD1-1 of the first group to the second light emitting element LD1-2 of the first group, the light emitting element LD2 of the second group, and the light emitting element LD3 of the third group.

In an embodiment of the inventive concept, the second electrode CE may secure or increase the transmittance of the first area DP-A1 by including the electrode openings CE-OP and may be provided in common to the first light emitting elements LD1-1 of the first group, the second light emitting elements LD1-2 of the first group, the light emitting elements LD2 of the second group, and the light emitting elements LD3 of the third group.

Figure 7:
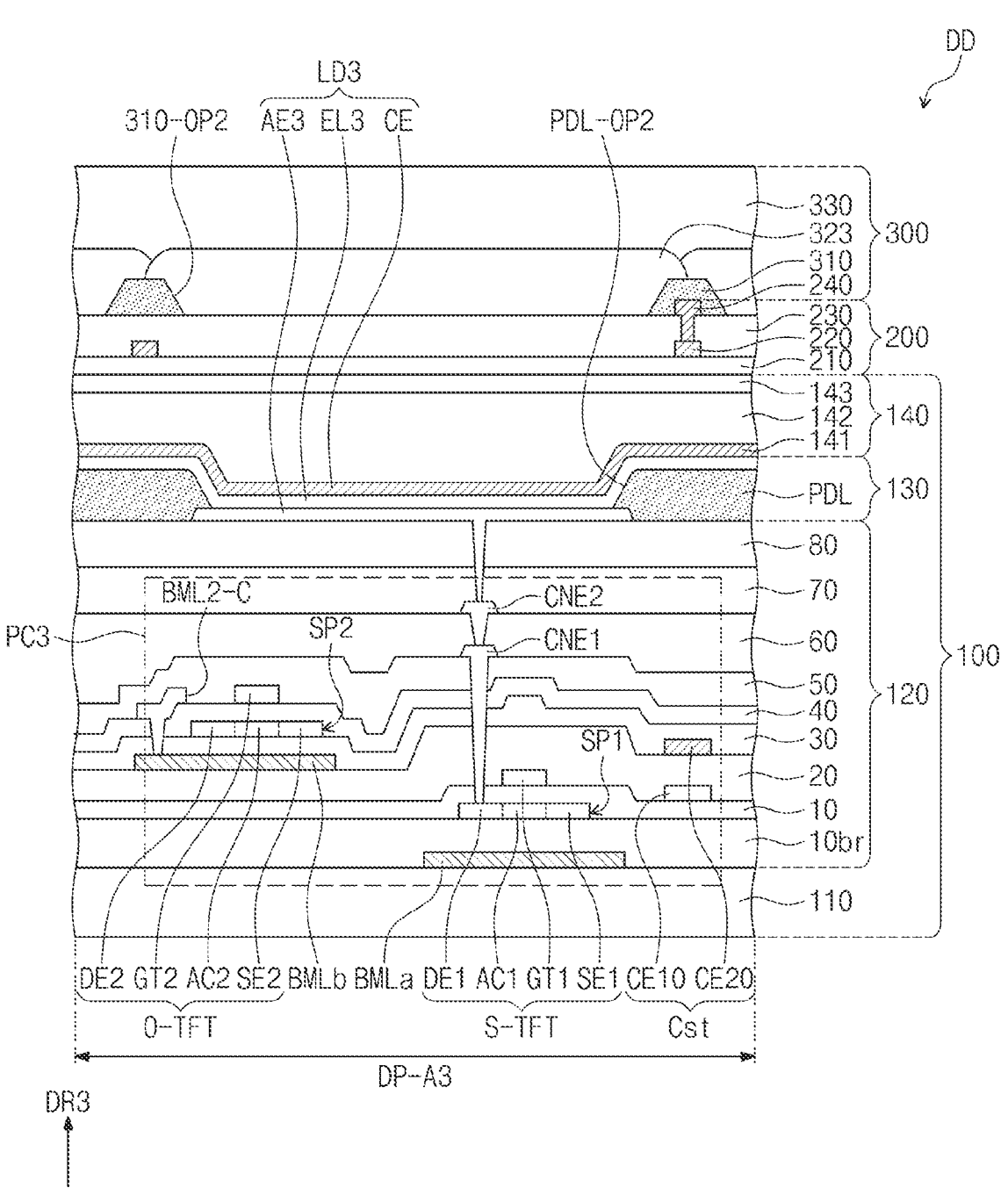
FIG. 7 is a cross-sectional view of a display device according to an embodiment of the inventive concept.
Figure 8:
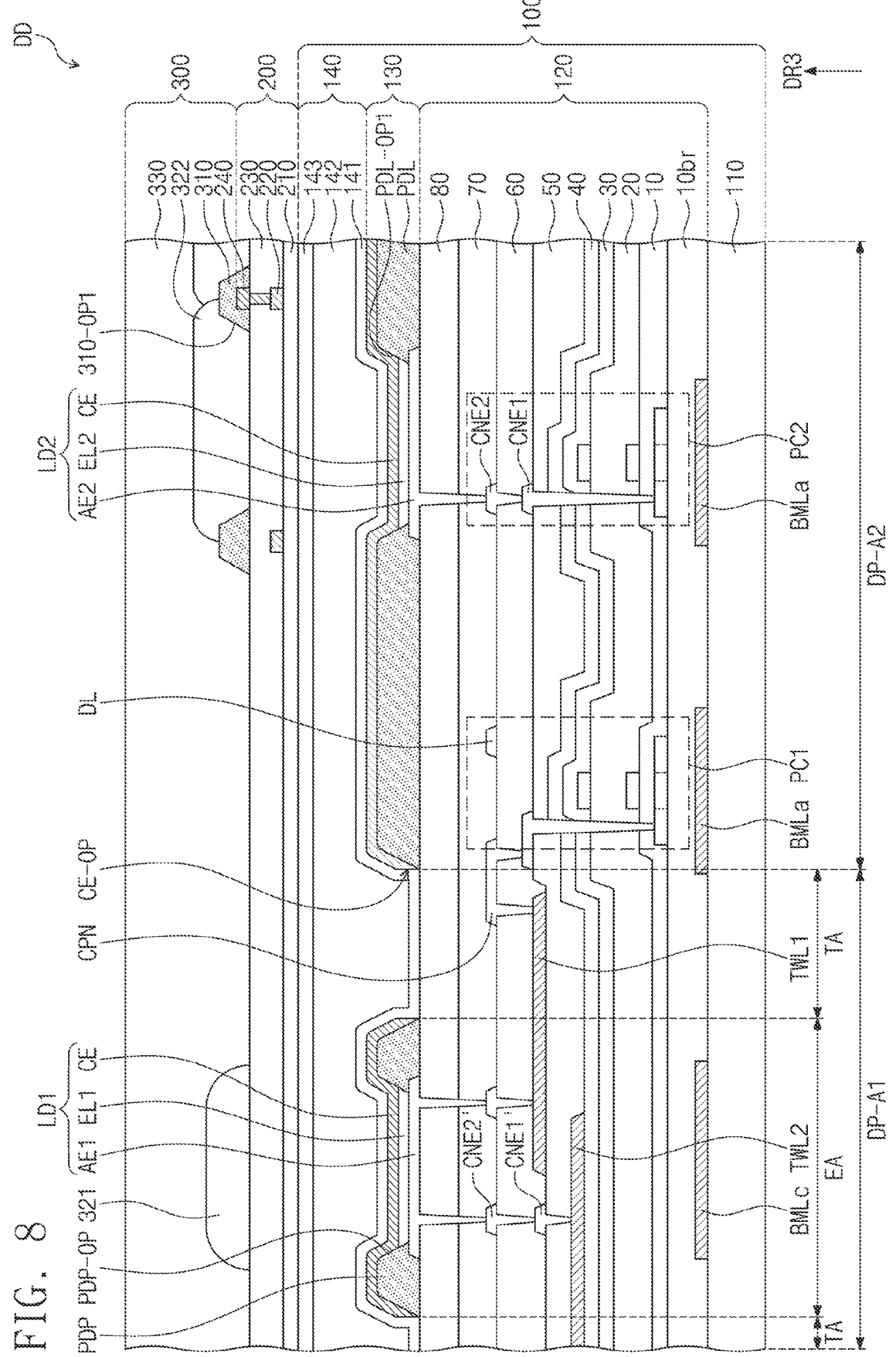
FIG. 8 is a cross-sectional view of a display device according to an embodiment of the inventive concept.

FIG. 7 is a cross-sectional view of the display device DD according to an embodiment of the inventive concept. FIG. 8 is a cross-sectional view of the display device DD according to an embodiment of the inventive concept. FIG. 7 is a cross-sectional view of the third area DP-A3, and FIG. 8 is a cross-sectional view of the first area DP-A1 and the second area DP-A2.

FIG. 7 illustrates the light emitting element LD3 of the third group, and a silicon thin film transistor S-TFT and an oxide thin film transistor O-TFT of the third pixel circuit PC3 (see FIG. 6A). In the equivalent circuit illustrated in FIG. 4, each of the third and fourth thin film transistors T3 and T4 may be the oxide thin film transistor O-TFT, and each of the remaining transistors may be the silicon thin film transistor S-TFT. In FIG. 8, portions of a light emitting element LD1 of the first group and the first pixel circuit PC1 are illustrated, and portions of the light emitting element LD2 of the second group and the second pixel circuit PC2 are illustrated. The light emitting element LD1 of the first group illustrated in FIG. 8 may be substantially the first light emitting element LD1-1 of the first group illustrated in FIG. 6A. A thin film transistor illustrated in FIG. 8 may be the sixth thin film transistor T6 illustrated in FIG. 4.

Referring to FIGS. 7 and 8 together, a buffer layer 10*br* may be disposed on the base layer 110. The buffer layer 10*br* may prevent metal atoms or impurities from diffusing from the base layer 110 into a first semiconductor pattern SP1. In addition, by controlling a heat supply rate during a crystallization process for forming the first semiconductor pattern SP1, the buffer layer 10*br* may allow the first semiconductor pattern SP1 to be uniformly formed.

A first light blocking pattern BMLa may be disposed on a lower portion of the silicon thin film transistor S-TFT, and a second light blocking pattern BMLb may be disposed on a lower portion of the oxide thin film transistor O-TFT. A third light blocking pattern BMLc may also be disposed on a lower portion of a first electrode AE1 included in the light emitting element LD1 of the first group.

The first and second light blocking patterns BMLa and BMLb may be disposed to overlap the first to third pixel circuits PC1, PC2, and PC3. The first and second light blocking patterns BMLa and BMLb may block an electric potential due to a polarization from affecting the first to third pixel circuits PC1, PC2, and PC3.

The first light blocking pattern BMLa may be disposed to correspond to at least a portion of each of the first to third pixel circuits PC1, PC2, and PC3 (see FIG. 6A). The first light blocking pattern BMLa may be disposed to overlap the driving thin film transistor T1 (see FIG. 4) implemented with the silicon thin film transistor S-TFT.

The first light blocking pattern BMLa may be disposed between the base layer 110 and the buffer layer 10*br*. In an embodiment of the inventive concept, an inorganic barrier layer is further disposed between the first light blocking pattern BMLa and the buffer layer 10*br*. The first light blocking pattern BMLa may be connected to an electrode or a line and may receive a constant voltage or a signal therefrom. According to an embodiment of the inventive concept, the first light blocking pattern BMLa may also be a floating electrode isolated from other electrodes or lines.

The second light blocking pattern BMLb may be disposed to correspond to the lower portion of the oxide thin film transistor O-TFT. The second light blocking pattern BMLb may be disposed between a second insulating layer 20 and a third insulating layer 30. In an embodiment, the second light blocking pattern BMLb is disposed on the same layer as the second electrode CE20 of the storage capacitor Cst. The second light blocking pattern BMLb may be connected to a contact electrode BML2-C to receive a constant voltage or a signal. In an embodiment, the contact electrode BML2-C is disposed on the same layer as a gate GT2 of the oxide thin film transistor O-TFT.

Each of the first light blocking pattern BMLa and the second light blocking pattern BMLb may include a reflective metal. In an embodiment, the first light blocking pattern BMLa and the second light blocking pattern BMLb are entirely the reflective metal. For example, each of the first light blocking pattern BMLa and the second light blocking pattern BMLb may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), titanium (Ti), and the like. The first light blocking pattern BMLa and the second light blocking pattern BMLb may include the same material or different materials.

Although not illustrated separately, the second light blocking pattern BMLb may be omitted according to an embodiment of the inventive concept. The first light blocking pattern BMLa may extend to a region on the lower portion of the oxide thin film transistor O-TFT, so that the first light blocking pattern BMLa may block an electrical potential due to polarization from affecting the oxide thin film transistor O-TFT.

The third light blocking pattern BMLc may be disposed on the lower portion of the first electrode AE1 to overlap the first electrode AE1 and may block internal light incident on the first electrode AE1 from a lower portion of the display device DD. Accordingly, it is possible to prevent a ghost phenomenon in which the shape of the first electrode AE1 is viewed overlapping an image generated by the display device DD. To this end, the surface area of the third light blocking pattern BMLc may be larger, when viewed in a plane, than a surface area of the first electrode AE1. The third light blocking pattern BMLc is a light blocking structure, overlaps an element area EA, and does not overlap a transmissive area TA.

The first semiconductor pattern SP1 may be disposed on the buffer layer 10br. The first semiconductor pattern SP1 may include a silicon semiconductor. For example, the silicon semiconductor may include amorphous silicon, polycrystalline silicon (i.e., polysilicon), or the like. For example, the first semiconductor pattern SP1 may include low temperature polysilicon.

FIG. 7 illustrates only a portion of the first semiconductor pattern SP1 disposed on the buffer layer 10br, and another portion of the first semiconductor pattern SP1 may be further disposed in another area. The first semiconductor pattern SP1 may be arranged in a specific rule across the pixels. The first semiconductor pattern SP1 may have different electrical properties depending on whether doped or not. In an embodiment, the first semiconductor pattern SP1 includes a first region having a high conductivity and a second region having a low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped at a lower concentration than the first region.

In an embodiment, the conductivity of the first region is higher than that of the second region, and the first region may substantially serve as an electrode or a signal line. The second region may substantially correspond to an active region (or a channel) of the transistor. In other words, a portion of the first semiconductor pattern SP1 may be the active region of the transistor, another portion thereof may be a source or a drain of the transistor, and another portion thereof may be a connection electrode or a connection signal line.

A source region SE1 (or a source SE1), an active region AC1 (or a channel AC1), and a drain region DE1 (or a drain DE1) of the silicon thin film transistor S-TFT may be provided within the first semiconductor pattern SP1. The source region SE1 and the drain region DE1 may respectively extend in opposite directions from the active region AC1 on the cross section.

A first insulating layer 10 may be disposed on the buffer layer 10br. The first insulating layer 10 may overlap the plurality of pixels in common and cover the first semiconductor pattern SP1. The first insulating layer 10 may be an inorganic layer and/or an organic layer and may have a single-layer structure or a multilayer structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may be a single-layer silicon oxide layer. In addition to the first insulating layer 10, each of insulating layers of the circuit layer 120 to be described later may be an inorganic layer and/or an organic layer and may have a single-layer structure or a multilayer structure. The inorganic layer may include at least one of the above-described materials but is not limited thereto.

A gate GT1 of the silicon thin film transistor S-TFT is disposed on the first insulating layer 10. The gate GT1 may be a portion of a metal pattern. The gate GT1 overlaps the active region AC1. The gate GT1 may function as a mask in the process of doping the first semiconductor pattern SP1. The gate GT1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), and the like, but is not particularly limited thereto.

The second insulating layer 20 may be disposed on the first insulating layer 10 and may cover the gate GT1. The third insulating layer 30 may be disposed on the second insulating layer 20. The second electrode CE20 of the storage capacitor Cst may be disposed between the second insulating layer 20 and the third insulating layer 30. In addition, the first electrode CE10 of the storage capacitor Cst may be disposed between the first insulating layer 10 and the second insulating layer 20.

A second semiconductor pattern SP2 may be disposed on the third insulating layer 30. The second semiconductor pattern SP2 may include an oxide semiconductor. The oxide semiconductor may include a plurality of regions divided according to whether metal oxide is reduced. A region in which the metal oxide is reduced (hereinafter referred to as a reduction region) has a higher conductivity than a region in which the metal oxide is not reduced (hereinafter referred to as a non-reduction region). The reduction region substantially serves as a source/drain of the transistor or a signal line. The non-reduction region substantially corresponds to a semiconductor region (or a channel) of the transistor. In other words, a portion of the second semiconductor pattern SP2 may be the semiconductor region of the transistor, another portion thereof may be the source/drain of the transistor, and another portion thereof may be a signal transmission region.

A source region SE2 (or a source SE2), an active region AC2 (or a channel AC2), and a drain region DE2 (or a drain DE2) of the oxide thin film transistor O-TFT may be provided within the second semiconductor pattern SP2. The source region SE2 and the drain region DE2 may respectively extend in opposite directions from the active region AC2 on the cross section. A fourth insulating layer 40 may be disposed on the third insulating layer 30. The fourth insulating layer 40 may overlap the plurality of pixels in common and cover the second semiconductor pattern SP2. The gate GT2 of the oxide thin film transistor O-TFT is disposed on the fourth insulating layer 40. The gate GT2 of the oxide thin film transistor O-TFT may be a portion of a metal pattern. The gate GT2 of the oxide thin film transistor O-TFT overlaps the active region AC2.

A fifth insulating layer 50 may be disposed on the fourth insulating layer 40 and may cover the gate GT2. A first connection electrode CNE1 may be disposed on the fifth insulating layer 50. The first connection electrode CNE1 may be connected to the drain region DE1 of the silicon thin film transistor S-TFT through a contact hole penetrating the first to fifth insulating layers 10, 20, 30, 40, and 50.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 through a contact hole penetrating the sixth insulating layer 60. A seventh insulating layer 70 may be disposed on the sixth insulating layer 60 and may cover the second connection electrode CNE2. An eighth insulating layer 80 may be disposed on the seventh insulating layer 70.

In an embodiment, each of the sixth insulating layer 60, the seventh insulating layer and the eighth insulating layer 80 is an organic layer. In an embodiment, the sixth insulating layer 60, the seventh insulating layer 70, and the eighth insulating layer 80 are entirely an organic material. For example, each of the sixth insulating layer 60, the seventh insulating layer 70, and the eighth insulating layer 80 may include a general-purpose polymer such as benzocyclobutene (BCB), polyimide, hexamethyldisiloxane (HMDSO), polymethylmethacrylate (PMMA), and polystyrene (PS), a polymer derivative having a phenolic group, an acrylate-based polymer, an imide-based polymer, an aryle-ther-based polymer, an amide-based polymer, a fluorine-based polymer, a p-xylene-based polymer, a vinyl alcohol-based polymer, blends thereof, and the like.

The light emitting element LD1 of the first group may include the first electrode AE1 (or a pixel electrode AE1), a light emitting layer EL1, and the second electrode CE (or the common electrode CE), and the light emitting element LD2 of the second group may include the first electrode AE2 (or a pixel electrode AE2), a light emitting layer EL2, and the second electrode CE (or the common electrode CE), and the light emitting element LD3 of the third group may include the first electrode AE3 (or a pixel electrode AE3), a light emitting layer EL3, and the second electrode CE (or the common electrode CE). The light emitting element LD1 of the first group may be substantially the first light emitting element LD1-1 of the first group illustrated in FIG. 6A, and the first electrode AE1 (or the pixel electrode AE1) included in the light emitting element LD1 of the first group may be substantially one of the (1-1)-th electrodes AE1-1 of the first group illustrated in FIG. 6B.

The second electrode CE included in the light emitting element LD1 of the first group, the light emitting element LD2 of the second group, and the light emitting element LD3 of the third group may have an integral shape and thus may be provided in common.

The first electrode AE1 of the light emitting element LD1 of the first group, the first electrode AE2 of the light emitting element LD2 of the second group, and the first electrode AE3 of the light emitting element LD3 of the third group may be disposed on the eighth insulating layer 80. Each of the first electrode AE1 of the light emitting element LD1 of the first group, the first electrode AE2 of the light emitting element LD2 of the second group, and the first electrode AE3 of the light emitting element LD3 of the third group may be a (semi-)transmissive electrode or a reflective electrode. According to an embodiment of the inventive concept, each of the first electrode AE1 of the light emitting element LD1 of the first group, the first electrode AE2 of the light emitting element LD2 of the second group, and the first electrode AE3 of the light emitting element LD3 of the third group may include a reflective layer constituted of Ag, Mg, Al, Pt, Pd, Au, Ni, Nd, Ir, Cr, a compound thereof, or the like, and a transparent or translucent electrode layer provided on the reflective layer. The transparent or translucent electrode layer may include at least one selected from a group including indium tin oxide (ITO), indium zinc oxide (IZO), indium gallium zinc oxide (IGZO), zinc oxide (ZnO) or indium oxide ($In_2O_3$), and aluminum doped zinc oxide (AZO). For example, each of the first electrode AE1 of the light emitting element LD1 of the first group, the first electrode AE2 of the light emitting element LD2 of the second group, and the first electrode AE3 of the light emitting element LD3 of the third group may include a laminated structure of ITO/Ag/ITO.

A pixel defining film PDL and a pixel defining pattern PDP may be disposed on the eighth insulating layer 80. The pixel defining film PDL and the pixel defining pattern PDP may include the same material and may be provided through the same process. Each of the pixel defining film PDL and the pixel defining pattern PDP may have a property of absorbing light and may have, for example, a black color. Each of the pixel defining film PDL and the pixel defining pattern PDP may include a black coloring agent. The black coloring agent may include a black dye and/or a black pigment. The black coloring agent may include carbon black, a metal such as chromium, or oxide thereof. Each of the pixel defining film PDL and the pixel defining pattern PDP may correspond to the light blocking pattern having a light blocking property.

The pixel defining pattern PDP may be disposed in the first area DP-A1. The pixel defining pattern PDP may cover a portion of the first electrode AE1 of the light emitting element LD1 of the first group. For example, the pixel defining pattern PDP may cover an edge of the first electrode AE1 of the light emitting element LD1 of the first group. For example, the pixel defining pattern PDP may cover a left edge of the first electrode AE1 and an upper left part of an upper surface of the first electrode AE1 adjacent the left edge and may cover a right edge of the first electrode AE1 and a right part of the upper surface adjacent the right edge.

The pixel defining film PDL may be disposed in the second area DP-A2 and the third area DP-A3. The pixel defining film PDL may cover a portion of each of the first electrode AE2 of the light emitting element LD2 of the second group and the first electrode AE3 of the light emitting element LD3 of the third group. For example, the pixel defining film PDL may cover a left edge of the first electrode AE2 and an upper left part of an upper surface of the first electrode AE2 adjacent the left edge and may cover a right edge of the first electrode AE2 and a right part of the upper surface adjacent the right edge. For example, a first opening PDL-OP1 exposing a portion of the first electrode AE2 of the light emitting element LD2 of the second group and a second opening PDL-OP2 exposing a portion of the first electrode AE3 of the light emitting element LD3 of the third group may be defined in the pixel defining film PDL. In an embodiment, the first opening PDL-OP1 and the second opening PDL-OP2 are through-holes that entirely passes through the pixel defining film PDL.

The pixel defining pattern PDP may increase a distance between the edge of the first electrode AE1 of the light emitting element LD1 of the first group and the second electrode CE, and the pixel defining film PDL may increase a distance between an edge of each of the first electrode AE2 of the light emitting element LD2 of the second group and the first electrode AE3 of the light emitting element LD3 of the third group and the second electrode CE. Accordingly, the pixel defining pattern PDP and the pixel defining film PDL may serve to prevent an arc and the like from occurring at the edge of each of the first electrodes AE1, AE2, and AE3.

In the first area DP-A1, an area overlapping a portion where the first electrode AE1 of the light emitting element LD1 of the first group and the pixel defining pattern PDP are disposed may be defined as the element area EA, and the remaining area may be defined as the transmissive area TA.

The first electrode AE1 of the light emitting element LD1 of the first group may be electrically connected to the first pixel circuit PC1 disposed in the second area DP-A2. For example, the first electrode AE1 of the light emitting element LD1 of the first group may be electrically connected to the first pixel circuit PC1 through the first connection line TWL1 and connection electrodes CNE2' and CPN. In this case, at least a portion of the first connection line TWL1 may overlap the transmissive area TA. Accordingly, the first connection line TWL1 may include or entirely include a light-transmissive material. According to an embodiment of the inventive concept, the connection electrode CPN is omitted, and the first connection line TWL1 is directly connected to a conductive pattern of the first pixel circuit PC1.

The first connection line TWL1 may be disposed between the fifth insulating layer and the sixth insulating layer 60 but is not particularly limited thereto. The connection electrodes CNE2' and CPN may be disposed between the sixth insulating layer 60 and the seventh insulating layer 70.

The first electrode AE1 of the light emitting element LD1 of the first group may be electrically connected to the second light emitting element LD1-2 (see FIG. 6A) of the first group disposed in the first area DP-A1. For example, the first electrode AE1 of the light emitting element LD1 of the first group may be electrically connected to the second light emitting element LD1-2 (see FIG. 6A) of the first group disposed in the first area DP-A1 through the second connection line TWL2 and a connection electrode CNE1' and the connection electrode CNE2'. In this case, at least a portion of the second connection line TWL2 may overlap the transmissive area TA. Accordingly, the second connection line TWL2 may include or entirely include a light-transmissive material. However, embodiments of the inventive concept are not limited thereto, and the second connection line TWL2 may overlap only the element area EA, and not the transmissive area TA. Each of the connection electrodes CNE1' and CNE2' may be provided in plurality.

The first connection line TWL1 and the second connection line TWL2 may include the same material. The first connection line TWL1 and the second connection line TWL2 may include a light-transmissive material and may include, for example, a transparent conductive material for signal transmission. Specifically, each of the first connection line TWL1 and the second connection line TWL2 may include transparent conductive oxide (TCO) such as indium tin oxide (ITO), indium zinc oxide (IZO), indium gallium zinc oxide (IGZO), zinc oxide (ZnO), and indium oxide ($In_2O_3$).

The second connection line TWL2 may be disposed between the fourth insulating layer 40 and the fifth insulating layer 50 but is not particularly limited thereto.

The first connection line TWL1 or the second connection line TWL2 may overlap the transmissive area TA. For example, at least a portion of the first connection line TWL1 may overlap the transmissive area TA. Even when the second connection line TWL2 overlaps the transmissive area TA through which an optical signal moves, deformation of the optical signal such as diffraction may be minimized.

The light emitting layer EL1 of the light emitting element LD1 of the first group may be disposed on the first electrode AE1 of the light emitting element LD1 of the first group, the light emitting layer EL2 of the light emitting element LD2 of the second group may be disposed on the first electrode AE2 of the light emitting element LD2 of the second group, and the light emitting layer EL3 of the light emitting element LD3 of the third group may be disposed on the first electrode AE3 of the light emitting element LD3 of the third group. In this embodiment, each of the light emitting layers EL1, EL2, and EL3 may emit light of at least one color of blue, red, or green.

The second electrode CE may be disposed in common on the light emitting layers EL1, EL2, and EL3. The second electrode CE may have an integral shape and may be disposed in common in the plurality of pixels PX (see FIG. 5).

The electrode openings CE-OP may be defined in the second electrode CE to secure or increase the transmittance of the transmissive area TA. Because the second electrode CE is not disposed in the transmissive area TA, the transmittance of the transmissive area TA may be further increased for an optical signal.

Although not illustrated, a hole control layer may be disposed between the first electrodes AE1, AE2, and AE3 and the light emitting layers EL1, EL2, and EL3. The hole control layer may include a hole transport layer and may further include a hole injection layer. An electron control layer may be disposed between the light emitting layers EL1, EL2, and EL3 and the second electrode CE. The electron control layer may include an electron transport layer and may further include an electron injection layer. The hole control layer and the electron control layer may be provided in common in the plurality of pixels PX (see FIG. 5) by using an open mask.

The encapsulation layer 140 may be disposed on the light emitting element layer 130. The encapsulation layer 140 may include an inorganic layer 141, an organic layer 142, and an inorganic layer 143 sequentially laminated, but layers constituting the encapsulation layer 140 are not limited thereto.

The inorganic layers 141 and 143 may protect the light emitting element layer 130 from moisture and oxygen, and the organic layer 142 may protect the light emitting element layer 130 from foreign matter such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acrylate-based organic layer but is not limited thereto.

The sensor layer 200 may be disposed on the display panel 100. The sensor layer 200 may be referred to as a sensor, an input sensing layer, or an input sensing panel. The sensor layer 200 may include a base layer 210, a first conductive layer 220, a sensing insulating layer 230, and a second conductive layer 240.

The base layer 210 may be directly disposed on the display panel 100. The base layer 210 may be an inorganic layer including at least one of silicon nitride, silicon oxynitride, or silicon oxide. Alternatively, the base layer 210 may be an organic layer including epoxy resin, acrylic resin, or imide-based resin. The base layer 210 may have a single-layer structure or may have a multilayer structure laminated in the third direction DR3.

Each of the first conductive layer 220 and the second conductive layer 240 may have a single-layer structure or may have a multilayer structure laminated in the third direction DR3. The first conductive layer 220 and the second conductive layer 240 may include conductive lines defining a mesh-shaped sensing electrode. In an embodiment, the conductive lines of the first conductive layer 220 and the second conductive layer 240 do not overlap the first opening PDL-OP1, the second opening PDL-OP2, and an opening PDP-OP, but may overlap the pixel defining pattern PDP and the pixel defining film PDL. The sensing electrode defined by the first conductive layer 220 and the second conductive layer 240 may overlap at least the third area DP-A3 illustrated in FIG. 5. In an embodiment, the opening PDP-OP is a through-hole that entirely passes through the pixel defining film PDL.

The conductive layer having the single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), and indium zinc tin oxide (IZTO). In addition, the transparent conductive layer may include a conductive polymer such as PEDOT, metal nanowires, graphene, and the like.

The conductive layer having the multilayer structure may include metal layers. The metal layers may have, for example, a three-layer structure of titanium/aluminum/titanium. The conductive layer having the multilayer structure may include at least one metal layer and at least one transparent conductive layer.

The sensing insulating layer 230 may be disposed between the first conductive layer 220 and the second conductive layer 240. The sensing insulating layer 230 may include an inorganic film. The inorganic film may include at least one of aluminum oxide, titanium oxide, silicon oxide, silicon nitride, silicon oxynitride, zirconium oxide, or hafnium oxide.

Alternatively, the sensing insulating layer 230 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

The anti-reflection layer 300 may be disposed on the sensor layer 200. The anti-reflection layer 300 may include a division layer 310, a first color filter 321, a second color filter 322, a third color filter 323, and a planarization layer 330. The anti-reflection layer 300 may be omitted in an alternate embodiment.

A material constituting the division layer 310 is not particularly limited as long as its material absorbs light. The division layer 310 may be a layer having a black color and may include, in an embodiment, a black coloring agent. The black coloring agent may include a black dye and/or a black pigment. The black coloring agent may include carbon black, a metal such as chromium, or oxide thereof.

The division layer 310 may cover the second conductive layer 240 of the sensor layer 200. The division layer 310 may prevent reflection of external light by the second conductive layer 240. In an embodiment, the division layer 310 overlaps the second area DP-A2 and the third area DP-A3 and does not overlap the first area DP-A1. Accordingly, when the division layer 310 is not disposed in the first area DP-A1, the transmittance of the first area DP-A1 may be further increased.

A plurality of openings 310-0P1 and 310-0P2 may be defined in the division layer 310. A first opening 310-0P1 may overlap the first electrode AE2 of the light emitting element LD2 of the second group, and a second opening 310-0P2 may overlap the first electrode AE3 of the light emitting element LD3 of the third group. In an embodiment, the openings 310-0P1 and 310-0P2 are through-holes that entirely pass through the division layer 310.

The first color filter 321 may overlap the first area DP-A1, the second color filter 322 may overlap the second area DP-A2, and the third color filter 323 may overlap the third area DP-A3. Each of the first color filter 321, the second color filter 322, and the third color filter 323 may overlap a corresponding one of the first electrodes AE1, AE2, and AE3.

Because the division layer 310 does not overlap the first area DP-A1, the first color filter 321 may be spaced apart from the division layer 310. That is, in an embodiment, the first color filter 321 is not in contact with the division layer 310. The second color filter 322 may cover the first opening 310-0P1, and the third color filter 323 may cover the second opening 310-0P2. In an embodiment, each of the second color filter 322 and the third color filter 323 are in contact with the division layer 310. In an embodiment, opening surface areas of the first and second openings 310-0P1 and 310-0P2 of the division layer 310 are respectively larger than opening surface areas of the first and second openings PDL-OP1 and PDL-OP2 of the pixel defining film PDL.

The planarization layer 330 may cover the division layer 310, the first color filter 321, the second color filter 322, and the third color filter 323. The planarization layer 330 may include an organic material and have a flat surface top surface. In an embodiment of the inventive concept, the planarization layer 330 is omitted.

Figure 9A:
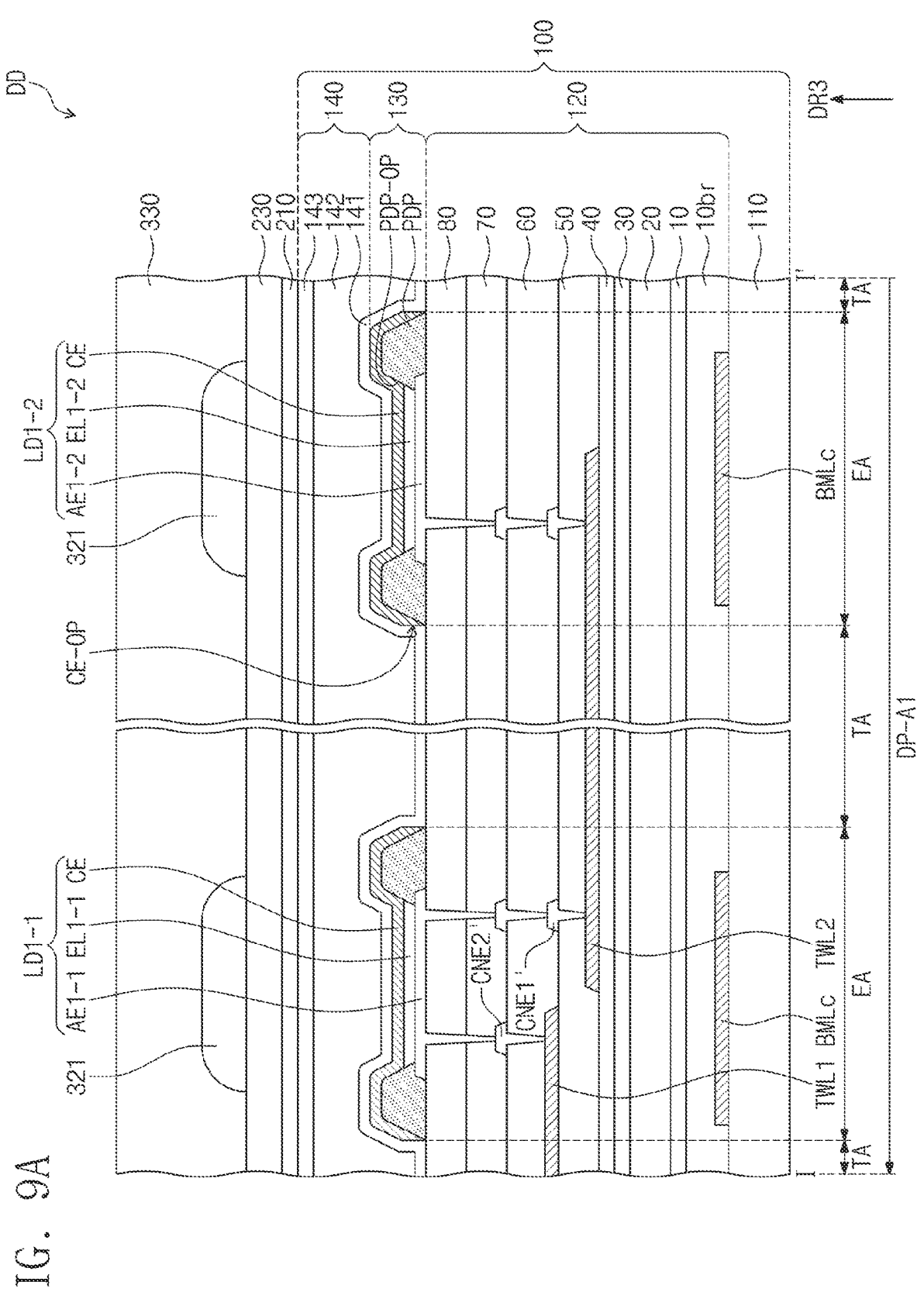
FIG. 9A is a cross-sectional view of a display device according to an embodiment of the inventive concept.
Figure 9B:
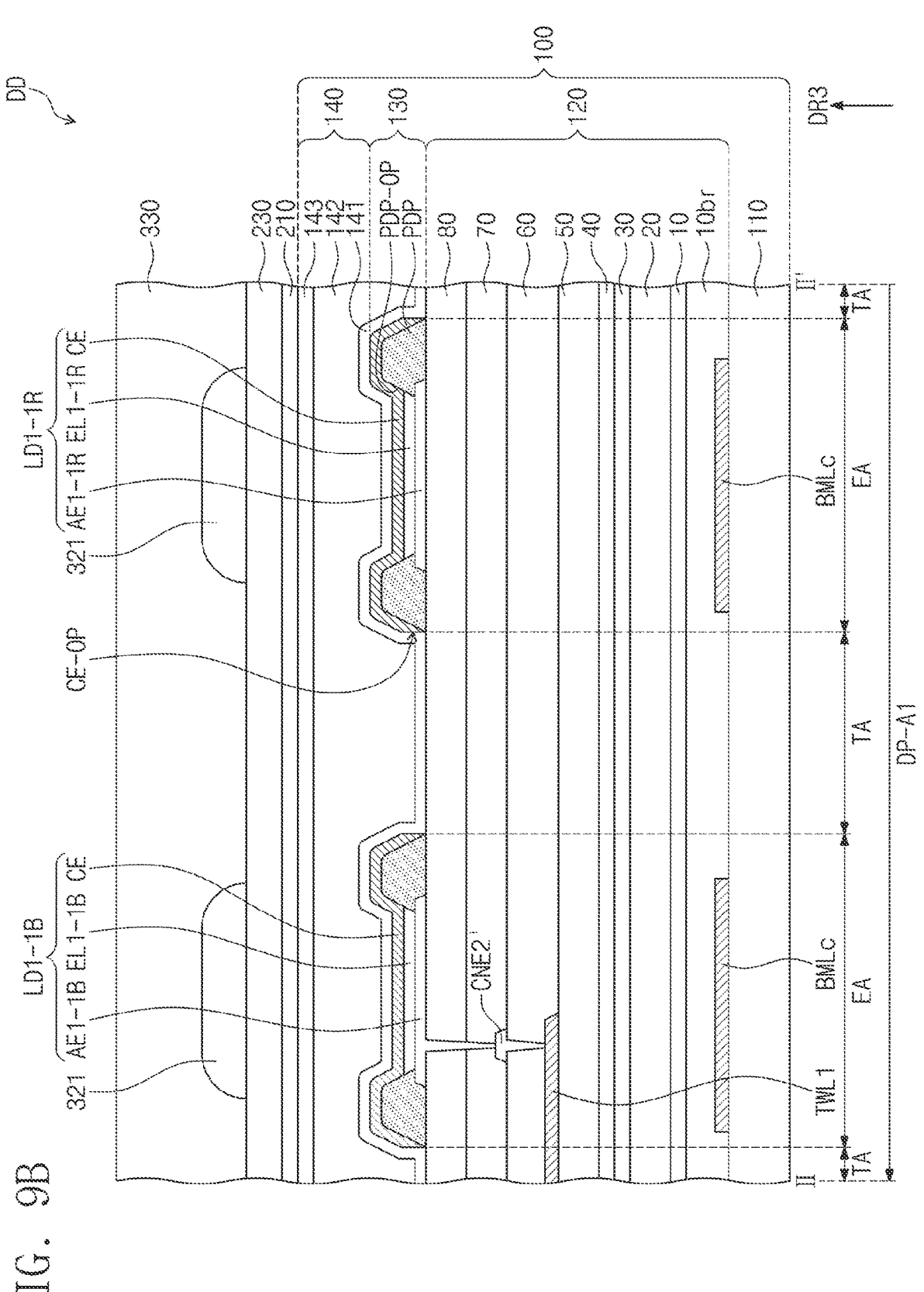
FIG. 9B is a cross-sectional view of a display device according to an embodiment of the inventive concept.

FIG. 9A is a cross-sectional view of the display device DD according to an embodiment of the inventive concept. FIG. 9B is a cross-sectional view of the display device DD according to an embodiment of the inventive concept.

FIG. 9A is a cross-sectional view, according to an embodiment, taken along line I-I' illustrated in FIG. 6A. Detailed description of the components described above with reference to FIGS. 1 to 8 will not be given in the following description, and the description given above is applied equally.

FIG. 9A illustrates the first light emitting element LD1-1 of the first group and the second light emitting element LD1-2 of the first group included in one first pixel PX1. The transmissive area TA may be defined between the first light emitting element LD1-1 of the first group and the second light emitting element LD1-2 of the first group.

The first light emitting element LD1-1 of the first group may be electrically connected to the first pixel circuit PC1 (see FIG. 6A) through the first connection line TWL1 and the connection electrode CNE2'. For example, the (1-1)-th electrode AE1-1 of the first light emitting element LD1-1 of the first group may be electrically connected to the first pixel circuit PC1 (see FIG. 6A).

The first light emitting element LD1-1 of the first group may be electrically connected to the second light emitting element LD1-2 of the first group through the second connection line TWL2 and the connection electrodes CNE1' and CNE2'. For example, the (1-1)-th electrode AE1-1 of the first light emitting element LD1-1 of the first group may be electrically connected to the (1-2)-th electrode AE1-2 of the second light emitting element LD1-2 of the first group.

The first pixel circuit PC1 (see FIG. 6A) may drive the first light emitting element LD1-1 of the first group and the second light emitting element LD1-2 of the first group connected to the first light emitting element LD1-1 of the first group. Because a single first pixel circuit PC1 drives two light emitting elements LD1-1 and LD1-2 of the first group, the number of the first pixel circuits PC1 disposed in the second area DP-A2 may be reduced, and a space for disposing signal lines may be secured in the second area DP-A2.

Although the first and second connection lines TWL1 and TWL2 overlap the transmissive area TA, each of the first and second connection lines TWL1 and TWL2 includes a transparent conductive material, and thus the transmittance of the transmissive area TA may be secured or increased.

The third light blocking patterns BMLc may be respectively disposed on lower portions of the first light emitting element LD1-1 of the first group and the second light emitting element LD1-2 of the first group. The third light blocking patterns BMLc may be disposed, when viewed in a plane, to overlap the first light emitting element LD1-1 of the first group and the second light emitting element LD1-2 of the first group and not to overlap the transmissive area TA. For example, when viewed in a plane, the third light blocking patterns BMLc may be disposed to be spaced apart from each other to cover the first and second light emitting elements LD1-1 and LD1-2 of the first group and may not be disposed in other areas.

In an embodiment, the second electrode CE, which is provided in common to the first light emitting element LD1-1 of the first group and the second light emitting element LD1-2 of the first group, does not overlap the transmissive area TA. In an embodiment, the electrode openings CE-OP overlapping the transmissive area TA prevent the second electrode CE from overlapping the transmissive area TA. For example, each of the electrode openings CE-OP may be provided by depositing a material for manufacturing the second electrode CE on the entirety of the first area DP-A1 and thereafter, by irradiating only a portion overlapping the transmissive area TA with a laser beam. A description in this regard will be provided in detail later.

FIG. 9B is a cross-sectional view, according to an embodiment, taken along line II-II' illustrated in FIG. 6B.

FIG. 9B illustrates a first light emitting element LD1-1R of the first group included in the first color pixel PXA-R and a first light emitting element LD1-1B of the first group included in the third color pixel PXA-B.

Referring to FIG. 9B, the transmissive area TA may be defined between the first light emitting elements LD1-1R and LD1-1B that emit light of different colors.

Because the first light emitting elements LD1-1R and LD1-1B emit light of different colors, the first light emitting elements LD1-1R and LD1-1B may be respectively driven by different first pixel circuits PC1 (see FIG. 6A). That is, the (1-1)-th electrodes AE1-1R and AE1-1B of the first light emitting elements LD1-1R and LD1-1B are not electrically connected.

Although only a corresponding first connection line TWL1 and a corresponding connection electrode CNE2' connected to the first light emitting element LD1-1B are illustrated in FIG. 9B, other connection lines may be illustrated depending on a direction of a line along which a cross-sectional view is taken.

The third light blocking patterns BMLc may be disposed on lower portions of the first light emitting elements LD1-1R and LD1-1B, respectively. The third light blocking patterns BMLc may be disposed, when viewed in a plane, to overlap the first light emitting elements LD1-1R and LD1-1B and not to overlap the transmissive area TA. For example, when viewed in a plane, the third light blocking patterns BMLc may be disposed to be spaced apart from each other to cover the first light emitting elements LD1-1R and LD1-1B and may not be disposed in other areas.

In an embodiment, the second electrode CE provided in common to the first light emitting elements LD1-1R and LD1-1B does not overlap the transmissive area TA. In an embodiment, the electrode openings CE-OP overlapping the transmissive area TA prevent the second electrode CE from overlapping the transmissive area TA.

Referring to FIGS. 9A and 9B, in an embodiment of the inventive concept, the second electrode CE may increase the transmittance of the transmissive area TA by including the electrode openings CE-OP disposed between the light emitting elements LD1-1, LD1-2, LD1-1B, and LD1-1R in the first area DP-A1.

Figure 10A:
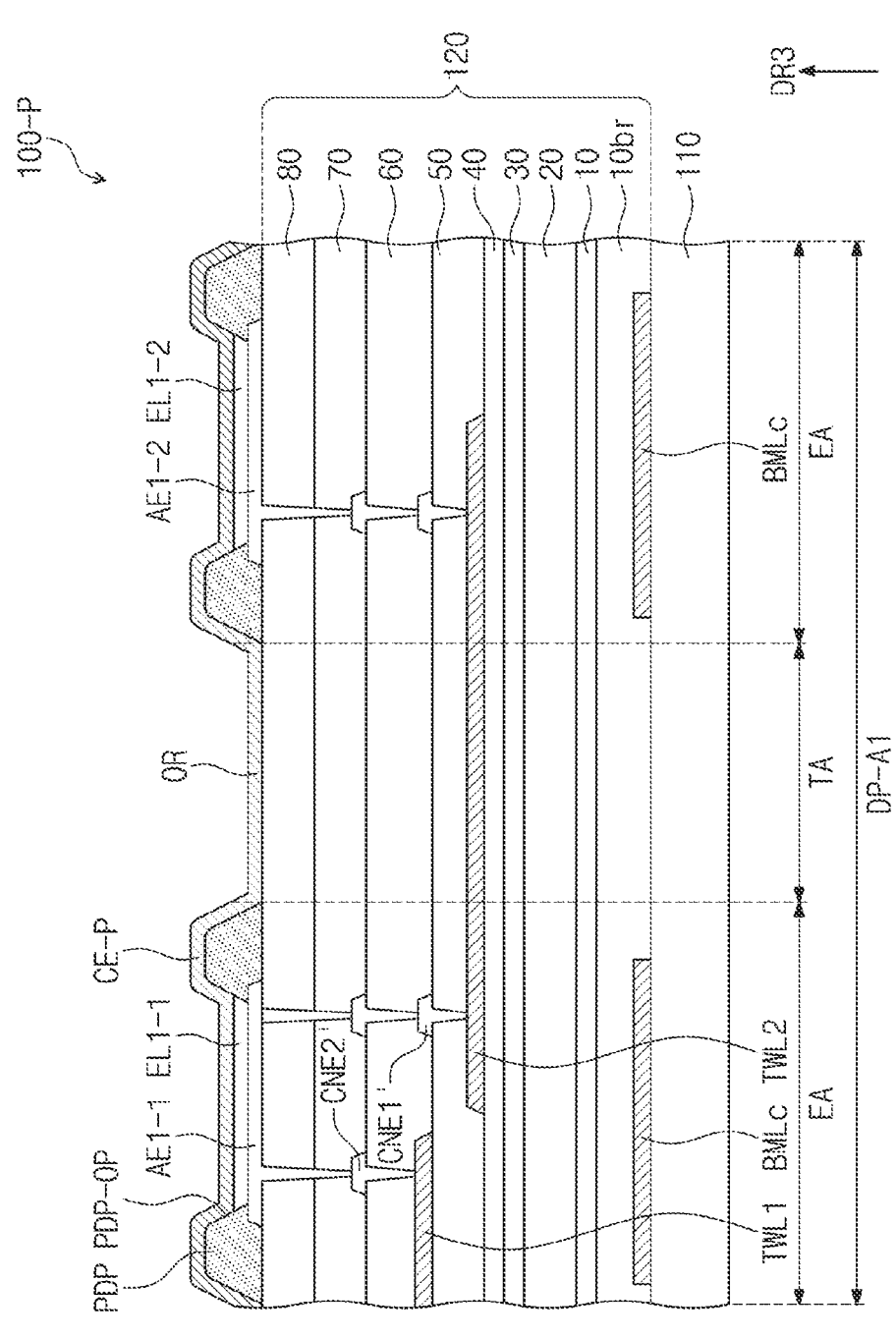
Figure 10B:
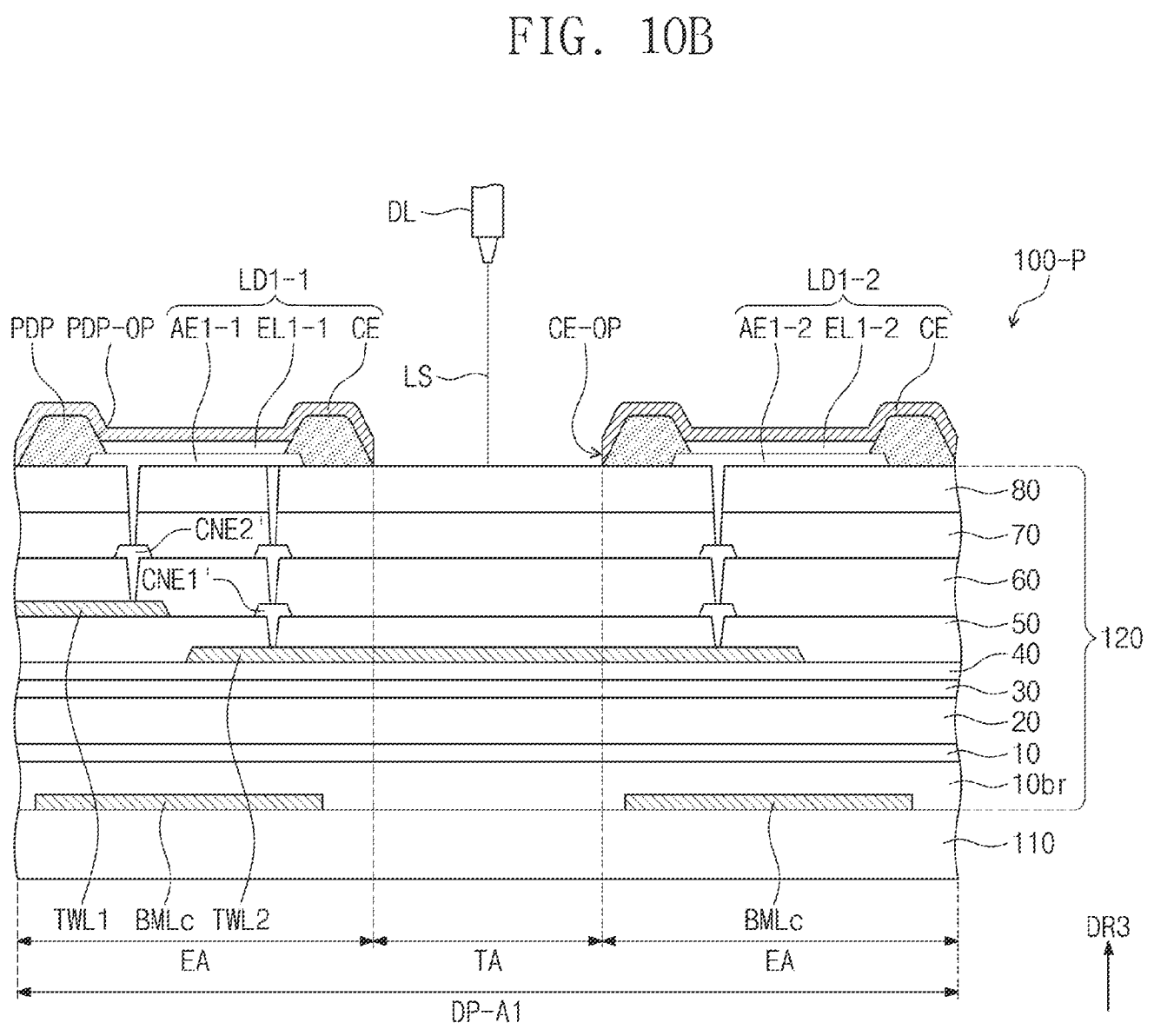
Figure 10C:
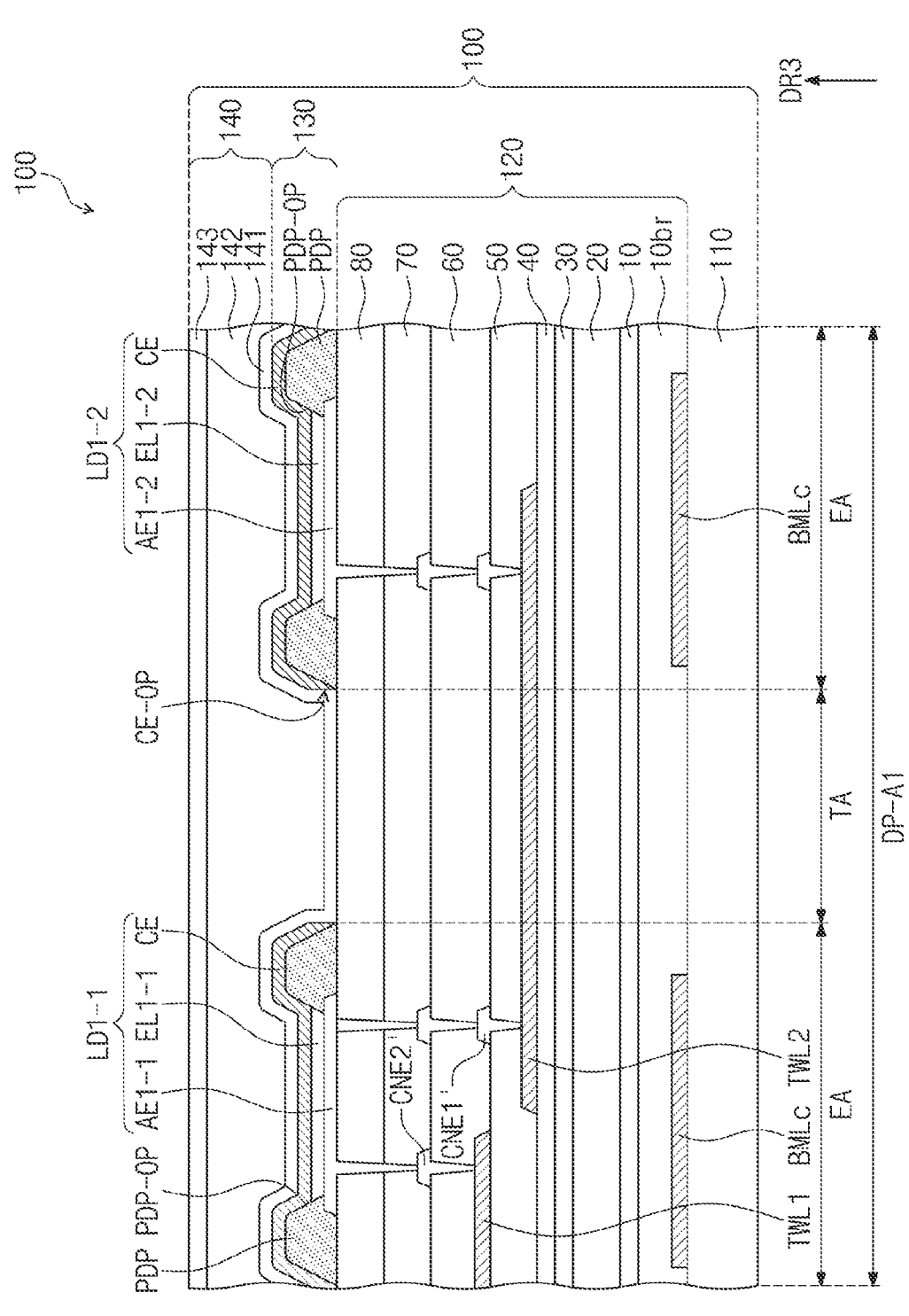

FIGS. 10A to 10C are cross-sectional views illustrating steps of a method of manufacturing an electronic device according to an embodiment of the inventive concept. Detailed description of the components described above with reference to FIGS. 1 to 9B will not be given in the following description, and the description given above is applied equally.

FIG. 10A illustrates providing a preliminary display panel 100-P. FIG. 10B illustrates irradiating the preliminary display panel 100-P with a laser beam LS. FIG. 10C illustrates forming a display panel 100.

Referring to FIGS. 10A to 10C, the method of manufacturing an electronic device according to an embodiment of the inventive concept may include the providing of the preliminary display panel 100-P and the irradiating with the laser beam LS.

Referring to FIG. 10A, the preliminary display panel 100-P may be provided by forming a base layer 110 and a circuit layer 120, and then, by forming, on the circuit layer 120, first electrodes AE1-1 and AE1-2, light emitting layers EL1-1 and EL1-2, and a second electrode CE-P. In the preliminary display panel 100-P, the second electrode CE-P may be formed to overlap an element area EA and a transmissive area TA.

Referring to FIGS. 10A and 10B, an electrode opening CE-OP may be formed by irradiating the preliminary display panel 100-P with the laser beam LS to remove a portion of the second electrode CE-P.

A laser irradiation device DL radiates the laser beam LS to form the electrode opening CE-OP. Specifically, the laser beam LS may be radiated to overlap the transmissive area TA. Each of removal portions OR of the second electrode CE-P overlapping the transmissive area TA is removed by the laser beam LS. The electrode opening CE-OP overlapping the transmissive area TA is formed in a second electrode CE.

In an embodiment, the laser beam LS is an infrared laser beam. The laser beam LS may be radiated in a direction from the second electrode CE-P toward the base layer 110. The laser beam LS may be sequentially provided to the removal portion OR of the second electrode CE-P, the circuit layer 120, and the base layer 110. When the laser beam LS has an infrared wavelength, a second connection line TWL2 included in the circuit layer 120 may not be affected by the laser beam LS.

Accordingly, only the removal portion OR of the second electrode CE-P may be removed by irradiating the transmissive area TA with the laser beam LS, and transmittance of the transmissive area TA may be secured or increased.

Referring to FIG. 10C, a method of manufacturing the display panel 100 may further include forming an encapsulation layer 140 on a light emitting element layer 130. The encapsulation layer 140 may protect the light emitting elements LD1-1 and LD1-2 from foreign matter such as moisture, oxygen, and dust particles.

By removing only the removal portion OR of the second electrode CE-P overlapping the transmissive area TA, the method of manufacturing the display panel according to an embodiment of the inventive concept may secure or increase the transmittance of the transmissive area TA while providing the second electrode CE in common to the light emitting elements LD1-1 and LD1-2.

The positions and shapes of the removal portions OR may be respectively the same, when viewed in a plane, as the positions and shapes of the electrode openings CE-OP described above with reference to FIG. 6C. However, embodiments of the inventive concept are not limited thereto.

Figure 11:
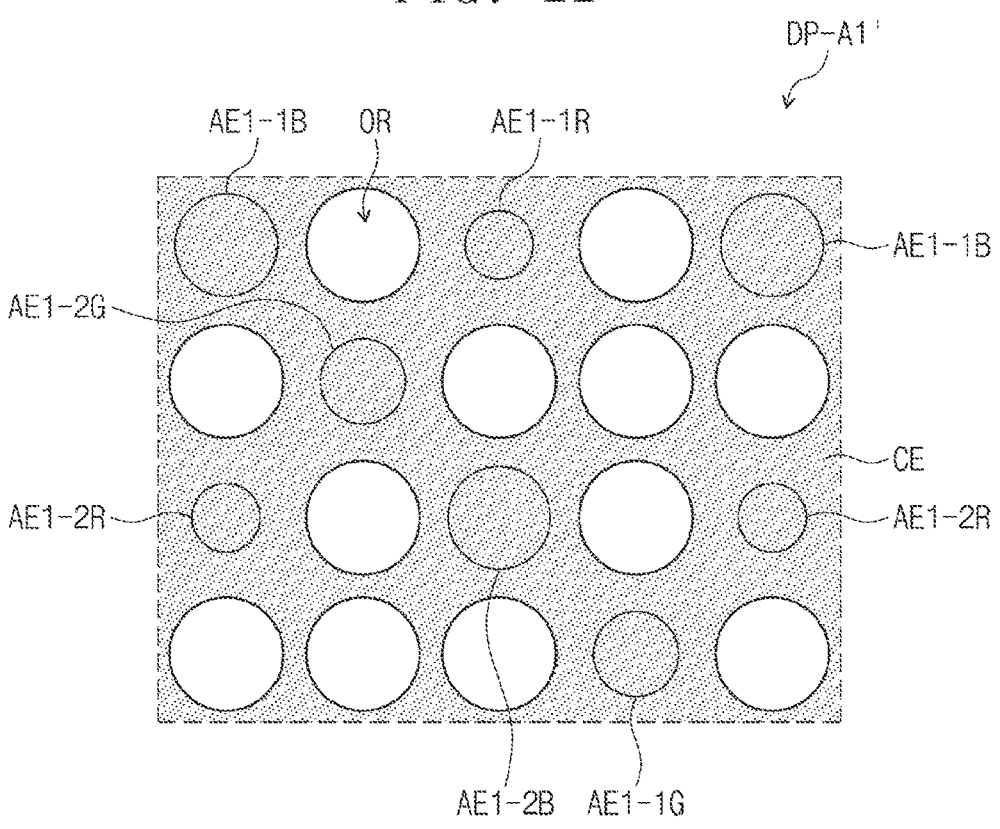
FIG. 11 is a plan view illustrating removal portions according to an embodiment of the inventive concept.
Figure 12:
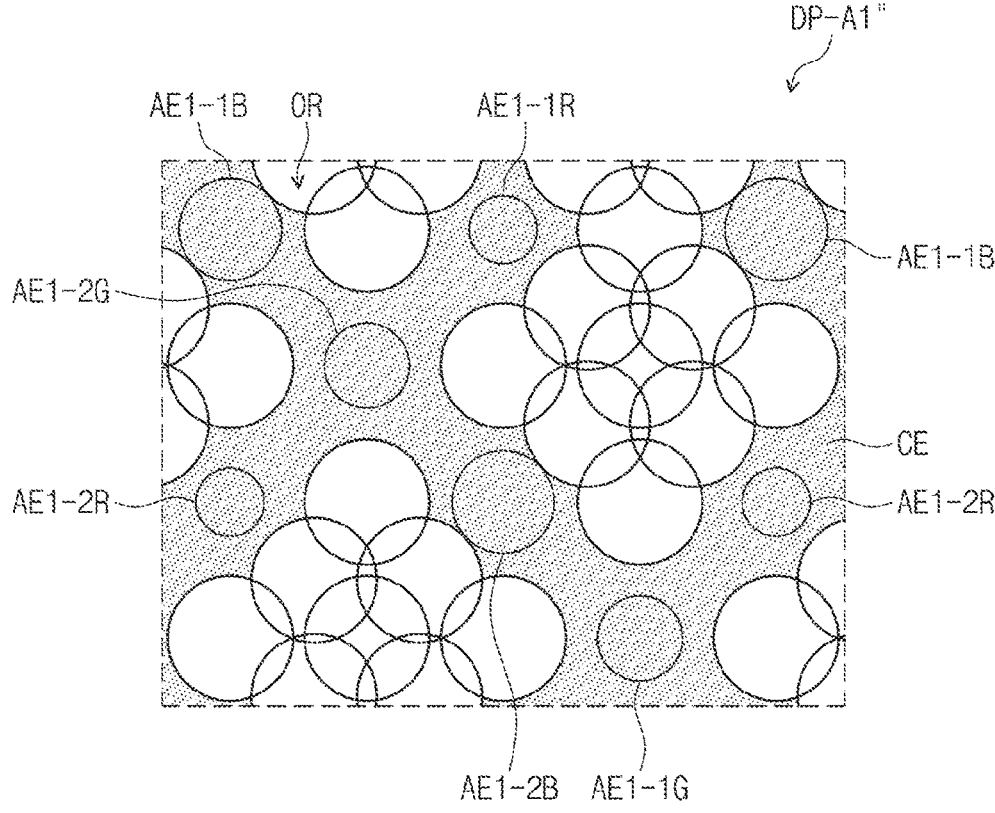
FIG. 12 is a plan view illustrating removal portions according to an embodiment of the inventive concept.

FIG. 11 is a plan view illustrating a second electrode CE from which removal portions OR of an embodiment of the inventive concept have been removed. FIG. 12 is a plan view illustrating a second electrode CE from which removal portions OR of an embodiment of the inventive concept have been removed. FIGS. 11 and 12 are enlarged plan views respectively illustrating first areas DP-A1' and DP-A1".

Referring to FIG. 11, the number of the removal portions OR, that is, the number of electrode openings CE-OP to be disposed may be greater in FIG. 11 than the number of the electrode openings CE-OP illustrated in FIG. 6C. As the number of the removal portions OR increases in FIG. 11, the number of the electrode openings CE-OP disposed in the second electrode CE may increase, and transmittance of the first area DP-A1' may further increase.

Referring to FIG. 12, the removal portions OR, that is, areas irradiated with a laser beam LS may partially overlap. Accordingly, the surface area of electrode openings CE-OP to be disposed in the second electrode CE may increase, and transmittance of the first area DP-A1" may further increase.

Referring to FIGS. 10A, 10B, 10C, 11, and 12, in a method of manufacturing a display panel according to an embodiment of the inventive concept, transmittance of a transmissive area TA may be increased by adjusting the positions and the number of the removal portions OR of a second electrode CE-P overlapping the transmissive area TA.

In the display panel of an embodiment of the inventive concept, the electrode openings overlapping the transmissive area are defined in the second electrode, so that the transmittance of the transmissive area may be secured or increased, and the second electrode for driving the light emitting elements may be secured.

The electronic device according to an embodiment of the inventive concept may have increased display quality by including the display panel having increased reliability.

In the method of manufacturing a display panel according to an embodiment of the inventive concept, only the removal portions of the second electrode overlapping the transmissive area are removed by using a laser. Accordingly, it is possible to secure or increase the transmittance of the transmissive area while providing the second electrode in common to the light emitting elements.

The display panel according to an embodiment may have increased transmittance for an optical signal, and thus may have increased display quality. Reliability of the electronic device according to an embodiment may be increased by including a display panel with increased transmittance. The method of manufacturing a display panel according to an embodiment may provide a method of manufacturing a display panel having increased transmittance.

Although exemplary embodiments of the inventive concept have been described herein, it is understood that various changes and modifications can be made by those skilled in the art within the spirit and scope of the inventive concept defined by the following claims or the equivalents.

Therefore, the exemplary embodiments described herein are not intended to limit the technical spirit and scope of the present invention, and all technical spirit within the scope of the following claims or the equivalents will be construed as being included in the scope of the present invention.

What is claimed is:

1. A display panel comprising a base layer including a first area through which an optical signal passes and a second area adjacent to the first area, connection lines disposed on the base layer, and first pixels and second pixels disposed on the base layer, wherein at least one of the first pixels comprises:

a first light emitting element of a first group including a first pixel electrode disposed in the first area, a first light emitting layer disposed on the first pixel electrode, and a common electrode disposed on the first light emitting layer; and a first pixel circuit electrically connected to the first light emitting element of the first group and disposed in the second area, wherein at least one of the second pixels comprises:

a light emitting element of a second group including a pixel electrode disposed in the second area; and a second pixel circuit connected to the light emitting element of the second group and disposed in the second area, wherein at least one of the connection lines comprises a first connection line configured to connect the first pixel electrode and the first pixel circuit, and wherein the common electrode comprises an electrode opening overlapping the connection line when viewed in a plan view.

2. The display panel of claim 1, wherein the at least one of the first pixels further comprises:

a second light emitting element of the first group including a second pixel electrode disposed in the first area;

a second light emitting layer disposed on the second pixel electrode; and the common electrode disposed on the second light emitting layer.

3. The display panel of claim 2, wherein, when viewed in the plan view, at least a portion of the common electrode extends from the first light emitting element of the first group to the second light emitting element of the first group.

4. The display panel of claim 2, wherein the connection lines further comprise a second connection line configured to connect the first pixel electrode and the second pixel electrode.

5. The display panel of claim 4, wherein the first connection line is insulated from the second connection line, and the first connection line overlaps at least a portion of the second connection line when viewed in the plan view.

6. The display panel of claim 2, wherein the first pixels comprise a first color pixel, a second color pixel, and a third color pixel configured to generate light of different colors, wherein each of the first color pixel to the third color pixel comprises the first light emitting element of the first group, the second light emitting element of the first group, and the first pixel circuit.

7. The display panel of claim 2, wherein the base layer comprises a first light blocking pattern disposed on a lower portion of the first pixel electrode and a second light blocking pattern disposed on a lower portion of the second pixel electrode, wherein the first light blocking pattern and the second light blocking pattern are spaced apart from each other.

8. The display panel of claim 1, wherein the connection lines comprise a transparent conductive material.

9. The display panel of claim 1, wherein the base layer further comprises a third area adjacent to the second area, the display panel further comprises third pixels disposed in the third area, and at least one of the third pixels comprises a light emitting element of a third group including a pixel electrode disposed in the third area and a third pixel circuit disposed in the third area.

10. An electronic device comprising:

a display panel including a base layer having a first area through which an optical signal passes, a second area which is adjacent to the first area and blocks the optical signal, and a third area adjacent to the second area, and first to third pixels disposed on the base layer; and an electronic module which overlaps the first area when viewed in a plan view and is disposed under the base layer, wherein at least one of the first pixels comprises:

a first light emitting element of a first group including a first pixel electrode disposed in the first area;

a second light emitting element of the first group including a second pixel electrode disposed in the first area; and a first pixel circuit connected to the first pixel electrode and disposed in the second area, wherein at least one of the second pixels comprises:

a light emitting element of a second group including a pixel electrode disposed in the second area; and a second pixel circuit connected to the pixel electrode disposed in the second area and disposed in the second area, and wherein at least one of the third pixels comprises:

a light emitting element of a third group including a pixel electrode disposed in the third area; and a third pixel circuit connected to the pixel electrode disposed in the third area and disposed in the third area, wherein the first light emitting element of the first group, the second light emitting element of the first group, the light emitting element of the second group, and the light emitting element of the third group comprises a common electrode having an integral shape, and wherein an electrode opening is disposed in the common electrode between the first light emitting element of the first group and the second light emitting element of the first group.

11. The electronic device of claim 10, wherein, when viewed in a plan view, at least a portion of the common electrode extends from the first light emitting element of the first group to the second light emitting element of the first group.

12. The electronic device of claim 10, wherein, when viewed in a plan view, the electrode opening overlaps the first area and does not overlap the second and third areas.

13. The electronic device of claim 10, wherein the display panel further comprises a first connection line configured to connect the first pixel electrode and the first pixel circuit, and a second connection line configured to connect the first pixel electrode and the second pixel electrode.

14. The electronic device of claim 13, wherein, when viewed in a plan view, at least a portion of the first connection line overlaps the electrode opening.

15. The electronic device of claim 13, wherein each of the first connection line and the second connection line comprises a transparent conductive material.

16. The electronic device of claim 10, wherein the base layer comprises a first light blocking pattern disposed on a lower portion of the first pixel electrode and a second light blocking pattern disposed on a lower portion of the second pixel electrode, wherein the first light blocking pattern and the second light blocking pattern are spaced apart from each other.

17. The electronic device of claim 10, wherein the first pixels comprise a first color pixel, a second color pixel, and a third color pixel configured to generate light of different colors, wherein each of the first color pixel to the third color pixel comprises the first light emitting element of the first group, the second light emitting element of the first group, and the first pixel circuit.

18. A method of manufacturing a display panel, the method comprising:

providing a preliminary display panel including a first light emitting element of a first group disposed in a first area, a second light emitting element of the first group disposed in the first area, a light emitting element of a second group disposed in a second area, a first pixel circuit disposed in the second area and connected to the first light emitting element of the first group, a second pixel circuit disposed in the second area and connected to the light emitting element of the second group, and a removal portion; and irradiating the removal portion with a laser beam, wherein each of the first light emitting element of the first group, the second light emitting element of the first group, and the light emitting element of the second group comprises a pixel electrode, a light emitting layer disposed on the pixel electrode, and a common electrode disposed on the light emitting layer wherein the common electrode included in the first light emitting element of the first group, the second light emitting element of the first group, and the light emitting element of the second group has an integral shape and wherein the removal portion is defined in the common electrode and is defined, when viewed in a plan view, between the first light emitting element of the first group and the second light emitting element of the first group.

19. The method of claim 18, wherein the first light emitting element of the first group is electrically connected to the first pixel circuit through a connection line, and when viewed in the plan view, at least a portion of the removal portion overlaps the connection line.

20. The method of claim 18, wherein, when viewed in the plan view, at least a portion of the common electrode connects the first light emitting element of the first group and the second light emitting element of the first group.

* * * * *